(12) United States Patent
Lee et al.

(10) Patent No.: US 11,099,745 B2
(45) Date of Patent: Aug. 24, 2021

(54) STORAGE DEVICE AND OPERATING METHOD THEREOF

(71) Applicant: SK hynix Inc., Icheon-si (KR)

(72) Inventors: Seon Ju Lee, Seongnam-si (KR); Min Hwan Moon, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/724,278

(22) Filed: Dec. 21, 2019

(65) Prior Publication Data

US 2020/0387313 A1    Dec. 10, 2020

(30) Foreign Application Priority Data

Jun. 4, 2019   (KR) .................. 10-2019-0066229

(51) Int. Cl.
  *G06F 3/06* (2006.01)
  *G11C 16/04* (2006.01)
  *G11C 16/26* (2006.01)
  *G11C 11/56* (2006.01)
  *G11C 16/34* (2006.01)
  (Continued)

(52) U.S. Cl.
  CPC ............ *G06F 3/0616* (2013.01); *G06F 3/064* (2013.01); *G06F 3/0659* (2013.01); *G06F 3/0679* (2013.01); *G06F 11/1068* (2013.01); *G11C 11/5671* (2013.01); *G11C 16/0483* (2013.01); *G11C 16/26* (2013.01); *G11C 16/3404* (2013.01); *G11C 16/349* (2013.01); *G11C 29/52* (2013.01)

(58) Field of Classification Search
  CPC .... G06F 3/064; G06F 11/1068; G06F 3/0679;
  G06F 3/0659; G06F 3/0652; G06F 3/0616; G11C 11/5671; G11C 16/3404; G11C 29/52; G11C 16/26; G11C 16/0483; G11C 16/349
  See application file for complete search history.

(56) References Cited

U.S. PATENT DOCUMENTS

2011/0138103 A1* 6/2011 Iliadis ................. G06F 12/0246
                                                         711/103
2016/0350023 A1* 12/2016 Lesartre ................. G11C 16/20
(Continued)

FOREIGN PATENT DOCUMENTS

KR  10-2014-0103755 A  8/2014
KR  10-2016-0087430 A  7/2016

*Primary Examiner* — Guy J Lamarre

(57) ABSTRACT

A memory controller having improved wear-leveling performance controls a memory device including a plurality of memory blocks. The memory controller includes a read operation controller, a cell state determiner, and a read reclaim controller. The read operation controller controls the memory device to read selected memory cells of a first block among the plurality of memory blocks by using at least one reference voltage. The cell state determiner compares a number of memory cells among the selected memory cells that are read as first memory cell with a reference number corresponding to the at least one reference voltage, and generates cell state information indicating a memory cell degradation degree corresponding to at least one state. The read claim controller controls the memory device to copy data stored in the first block to a second block, based on a comparison between the memory cell degradation degree with a threshold degradation degree.

19 Claims, 19 Drawing Sheets

(51) Int. Cl.
     *G06F 11/10*      (2006.01)
     *G11C 29/52*      (2006.01)

(56) References Cited

U.S. PATENT DOCUMENTS

| | | | | |
|---|---|---|---|---|
| 2016/0350179 | A1* | 12/2016 | Lin | H03M 13/2909 |
| 2017/0242748 | A1* | 8/2017 | Lin | H03M 13/458 |
| 2017/0337127 | A1* | 11/2017 | Sutardja | G11C 16/3495 |
| 2019/0138411 | A1* | 5/2019 | Lesartre | G06F 12/0238 |

\* cited by examiner

FIG. 13

| REFERENCE VOLTAGE | READ NUMBER OF MEMORY CELLS | REFERENCE NUMBER | MEMORY CELL DEGRADATION DEGREE |
|---|---|---|---|
| mean_E | b1 = 175 | a1 = 125 | b1−a1 = +50 |
| mean_P1 | b1+b2 = 415 | a1+a2 = 375 | (b1+b2)−(a1+a2) = +40 |
| mean_P2 | b1+b2+b3 = 655 | a1+a2+a3 = 625 | (b1+b2+b3)−(a1+a2+a3) = +30 |
| mean_P3 | b1+b2+b3+b4 = 915 | a1+a2+a3+a4 = 875 | (b1+b2+b3+b4)−(a1+a2+a3+a4) = +40 |

FIG. 15

| REFERENCE VOLTAGE | READ NUMBER OF MEMORY CELLS | REFERENCE NUMBER | MEMORY CELL DEGRADATION DEGREE |
|---|---|---|---|
| mean_E | c1 = 85 | a1 = 125 | c1−a1 = −40 |
| mean_P1 | c1+c2 = 330 | a1+a2 = 375 | (c1+c2)−(a1+a2) = −45 |
| mean_P2 | c1+c2+c3 = 575 | a1+a2+a3 = 625 | (c1+c2+c3)−(a1+a2+a3) = −50 |
| mean_P3 | c1+c2+c3+c4 = 815 | a1+a2+a3+a4 = 875 | (c1+c2+c3+c4)−(a1+a2+a3+a4) = −60 |

FIG. 16

| | BIT ERROR RATE ≤ SECOND THRESHOLD VALUE | BIT ERROR RATE > SECOND THRESHOLD VALUE |
|---|---|---|
| MEMORY CELL DEGRADATION DEGREE ≤ FIRST THRESHOLD VALUE | × | ○ |
| MEMORY CELL DEGRADATION DEGREE > FIRST THRESHOLD VALUE | ○ | ○ |

FIG. 17

| | READ COUNT > THIRD THRESHOLD VALUE | |
|---|---|---|
| | BIT ERROR RATE ≤ SECOND THRESHOLD VALUE | BIT ERROR RATE > SECOND THRESHOLD VALUE |
| READ COUNT ≤ THIRD THRESHOLD VALUE | MEMORY CELL DEGRADATION DEGREE ≤ FIRST THRESHOLD VALUE | × | ○ |
| | MEMORY CELL DEGRADATION DEGREE > FIRST THRESHOLD VALUE | ○ | ○ |
| × | | |

STORAGE DEVICE AND OPERATING METHOD THEREOF

CROSS-REFERENCE TO RELATED APPLICATION

The present application claims priority under 35 U.S.C. § 119(a) to Korean Patent Application No. 10-2019-0066229, filed on Jun. 4, 2019 in the Korean Intellectual Property Office, the entire disclosure of which is incorporated herein by reference.

BACKGROUND

1. Technical Field

The present disclosure generally relates to an electronic device, and more particularly, to a storage device and an operating method thereof.

2. Related Art

A storage device is a device that stores data under the control of a host device such as a computer or a smart phone. The storage device may include a memory device for storing data and a memory controller for controlling the memory device. A memory device can be classified into a volatile memory device and a nonvolatile memory device.

A volatile memory device is a memory device in which data is stored only when power is supplied, but data cannot be retrieved when the supply of power is interrupted. Non-limiting examples of volatile memory devices include a Static Random Access Memory (SRAM), a Dynamic Random Access Memory (DRAM), and the like.

A nonvolatile memory device is a memory device in which data can be retrieved even after the power supply is interrupted. Non-limiting examples of nonvolatile memory devices include a Read Only Memory (ROM), a Programmable ROM (PROM), an Electrically Programmable ROM (EPROM), an Electrically Erasable ROM (EEROM), a flash memory, and the like.

SUMMARY

Embodiments provide a storage device having improved wear-leveling performance and an operating method thereof.

In accordance with an aspect of the present disclosure, there is provided a memory controller for controlling a memory device including a plurality of memory blocks, the memory controller including: a read operation controller configured to control the memory device to read selected memory cells of a first block among the plurality of memory blocks by using at least one reference voltage among a plurality of reference voltages; a cell state determiner configured to compare a number of memory cells among the selected memory cells that are read as first memory cell with a reference number corresponding to the at least one reference voltage, and to generate cell state information indicating a memory cell degradation degree corresponding to at least one state among a plurality of states; and a read claim controller configured to control the memory device to copy data stored in the first block to a second block selected from the plurality of memory blocks, based on a comparison between the memory cell degradation degree with a threshold degradation degree.

In accordance with another aspect of the present disclosure, there is provided a memory controller for controlling a memory device including a plurality of memory blocks, the memory controller including: a read operation controller configured to control the memory device to read selected memory cells of a first block among the plurality of memory blocks by using at least one reference voltage among a plurality of reference voltages; a cell state determiner configured to compare a number of memory cells, among the selected memory cells, read as first memory cell by the at least one reference voltage with a reference number corresponding to the at least one reference voltage, and to generate cell state information indicating a memory cell degradation degree corresponding to at least one state among a plurality of states; a read counter configured to generate a read count information indicating a read count which is a number of times read operations are performed on the first block; an error corrector configured to perform error correction decoding on data read from the selected memory cells, and to generate bit error information indicating a bit error rate based on a result of the error correction decoding; and a read reclaim controller configured to control the memory device to copy data stored in the first block to a second block among the plurality of memory blocks, based on a result obtained by comparing the cell state information with a threshold degradation degree and a result obtained by comparing the bit error information with a threshold error rate, when the read count is greater than a threshold count.

In accordance with still another aspect of the present disclosure, there is provided a storage device including: a memory device including a plurality of memory blocks each having a plurality of memory cells; and a memory controller configured to control the memory device to read selected memory cells of a first block among the plurality of memory blocks by using at least one reference voltage among a plurality of reference voltages, to calculate a memory cell degradation degree corresponding to at least one state among a plurality of states, based on a result obtained by comparing a number of memory cells read as first memory cells by the at least one reference voltage among the selected memory cells with a reference number corresponding to the at least one reference voltage, and to control the memory device to copy data stored in the first block to a second block among the plurality of memory blocks, according to a result obtained by comparing a sample value determined based on the memory cell degradation degree corresponding to the at least one state with a threshold degradation degree.

In accordance with still another aspect of the present disclosure, there is provided a method for operating a storage device including a plurality of memory blocks, the method including: reading selected memory cells of a first block among a plurality of memory blocks by using at least one reference voltage among a plurality of reference voltages; calculating a memory cell degradation degree corresponding to at least one state among a plurality of states, based on the result obtaining by comparing a number of memory cells read as first memory cells by the at least one reference voltage among the selected memory cells with a reference number corresponding to the at least one reference voltage among a plurality of reference numbers; and copying data stored in the first block to a second block among the plurality of memory blocks based on a comparison result between the memory cell degradation degree and a threshold degradation degree.

BRIEF DESCRIPTION OF THE DRAWINGS

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey the scope of the example embodiments to those skilled in the art.

Figure 1:
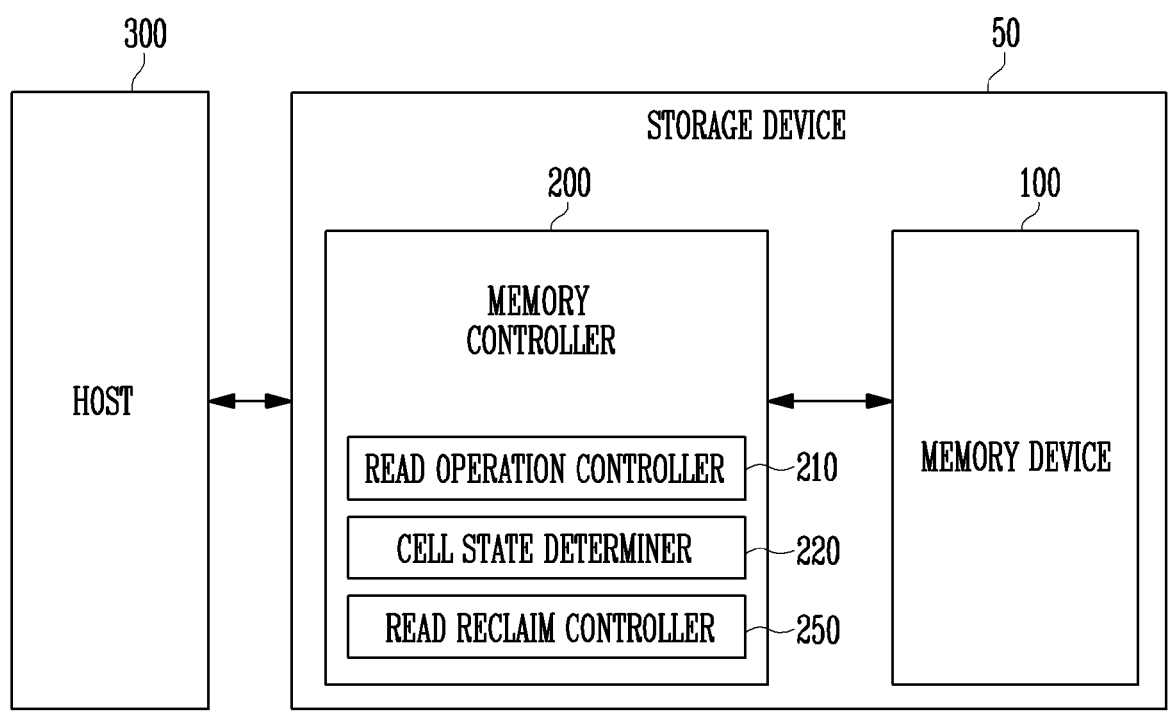

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout the disclosure.

FIG. 1 is a diagram illustrating a storage device in accordance with an embodiment of the present disclosure.

Figure 2:
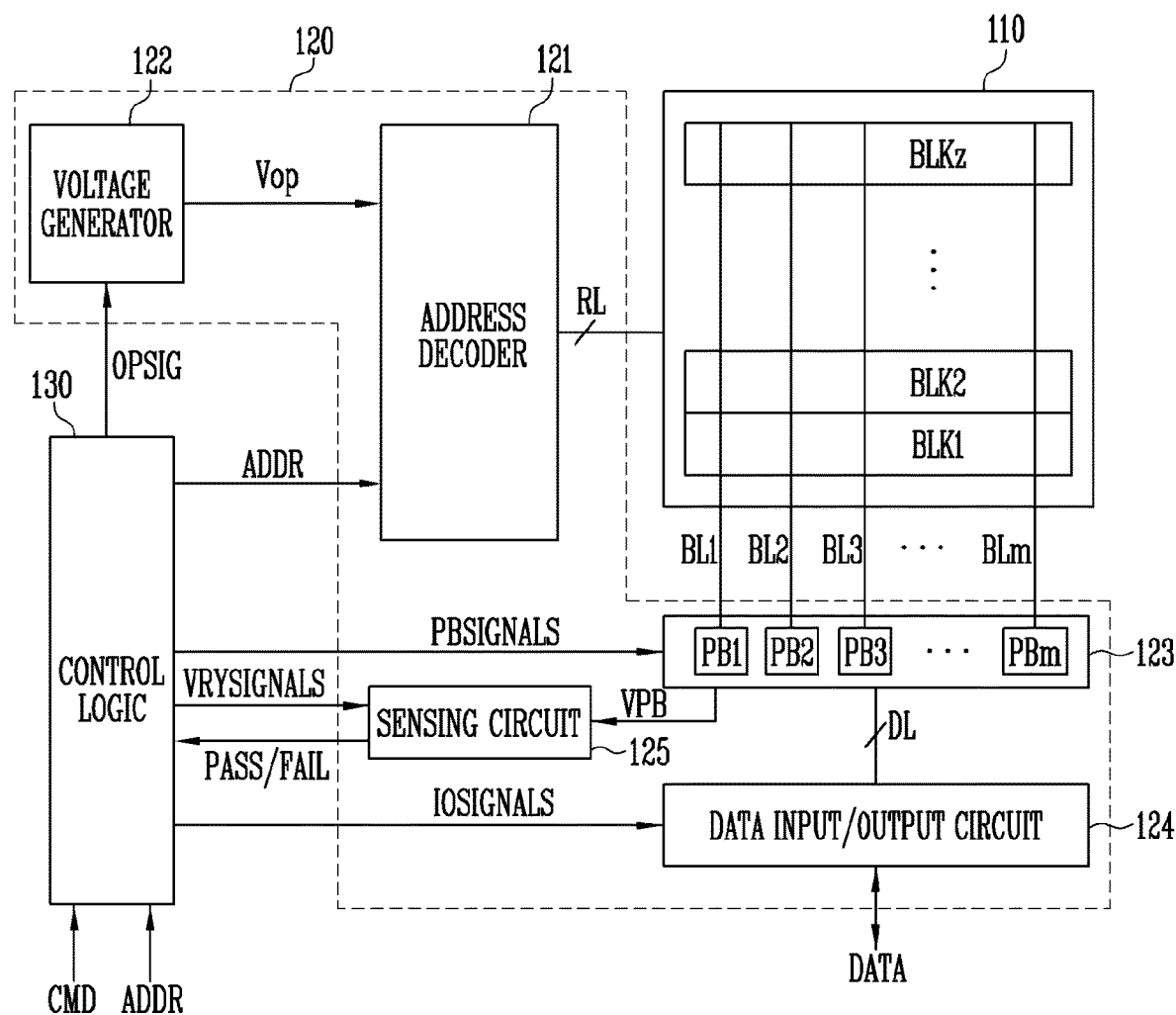

FIG. 2 is a diagram illustrating a structure of a memory device shown in FIG. 1.

Figure 3:
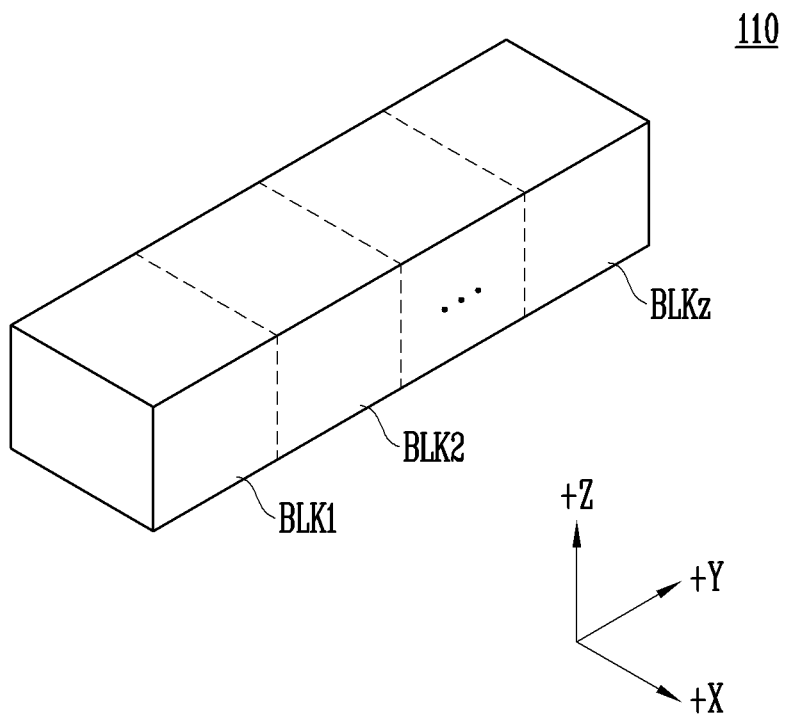

FIG. 3 is a diagram illustrating an embodiment of a memory cell array shown in FIG. 2.

Figure 4:
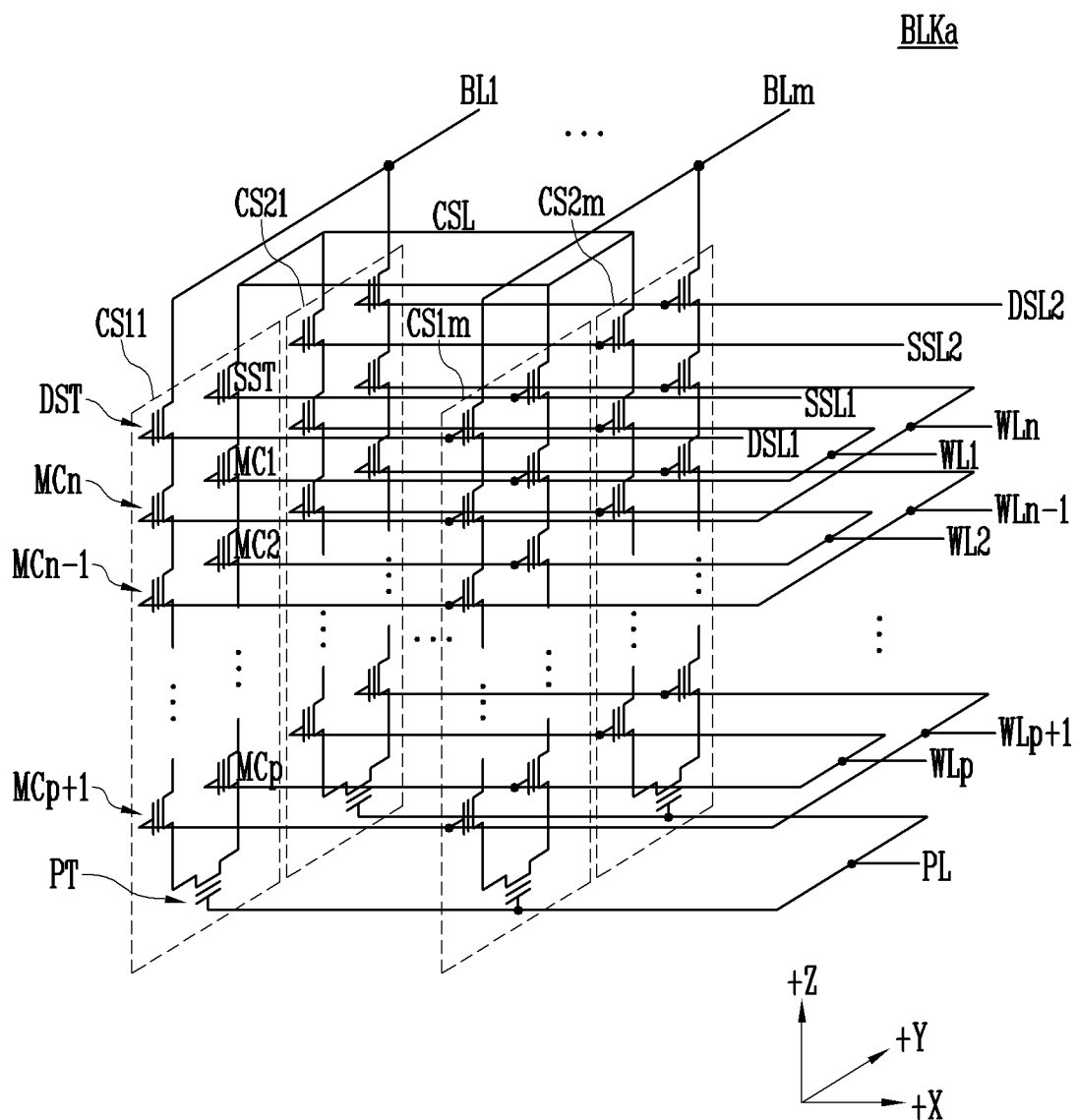

FIG. 4 is a circuit diagram illustrating any one memory block among the memory blocks shown in FIG. 3 according to an embodiment of the disclosure.

Figure 5:
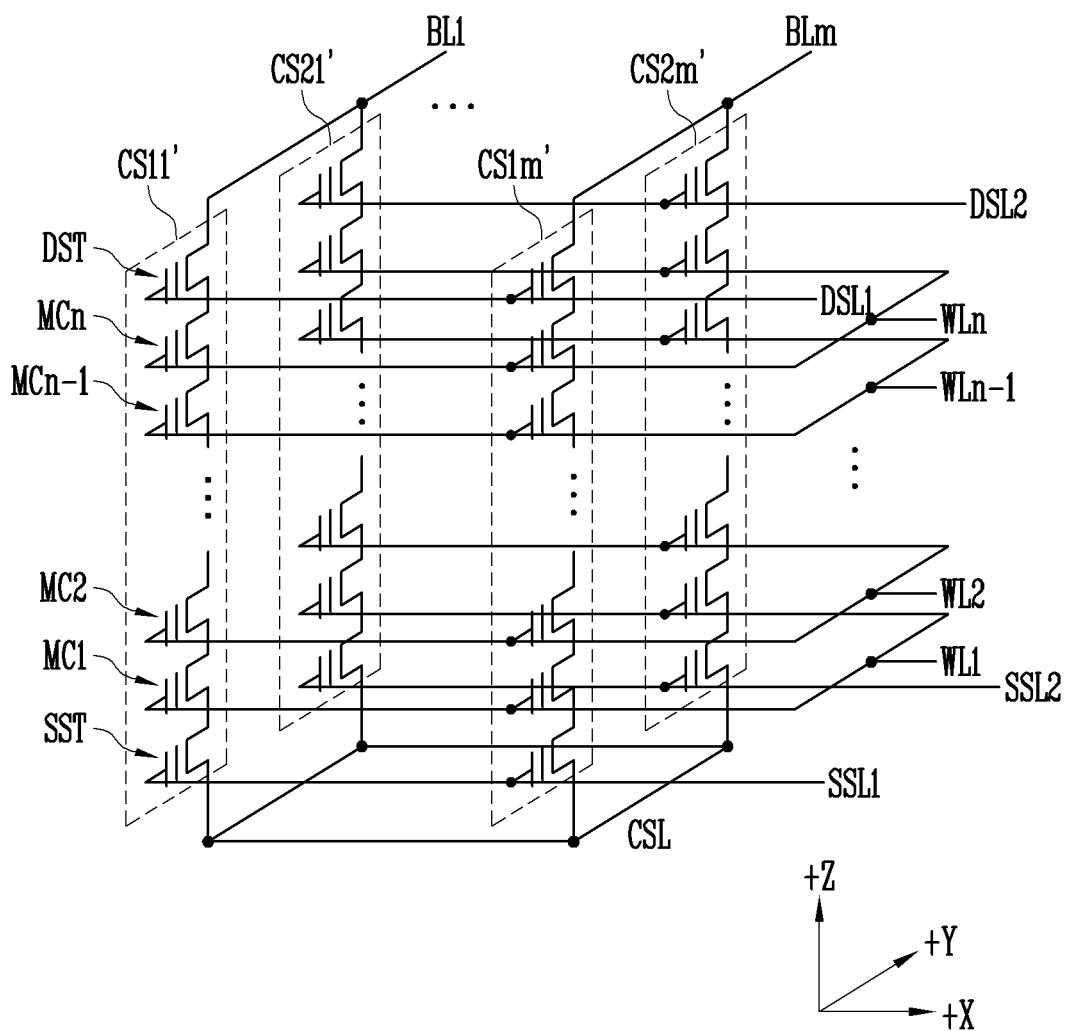

FIG. 5 is a circuit diagram illustrating another embodiment of a memory block among the memory blocks shown in FIG. 3.

Figure 6:
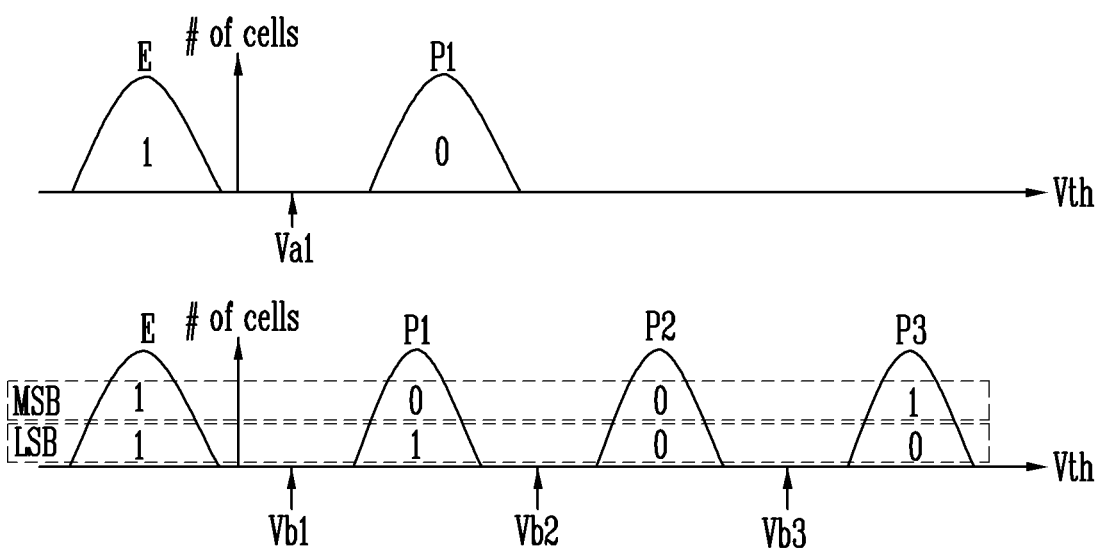

FIG. 6 is a diagram illustrating a threshold voltage distribution of memory cells and logical page data.

Figure 7:
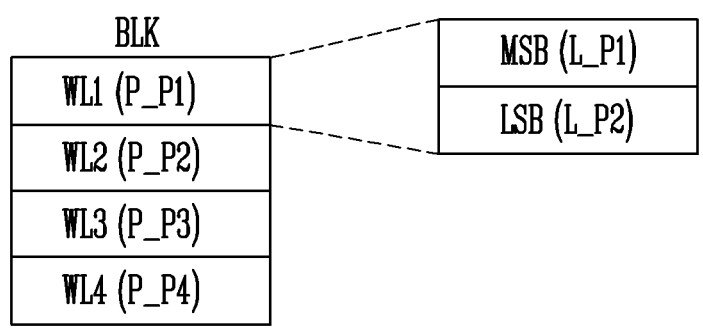

FIG. 7 is a diagram illustrating a physical page and a logical page.

Figure 8:
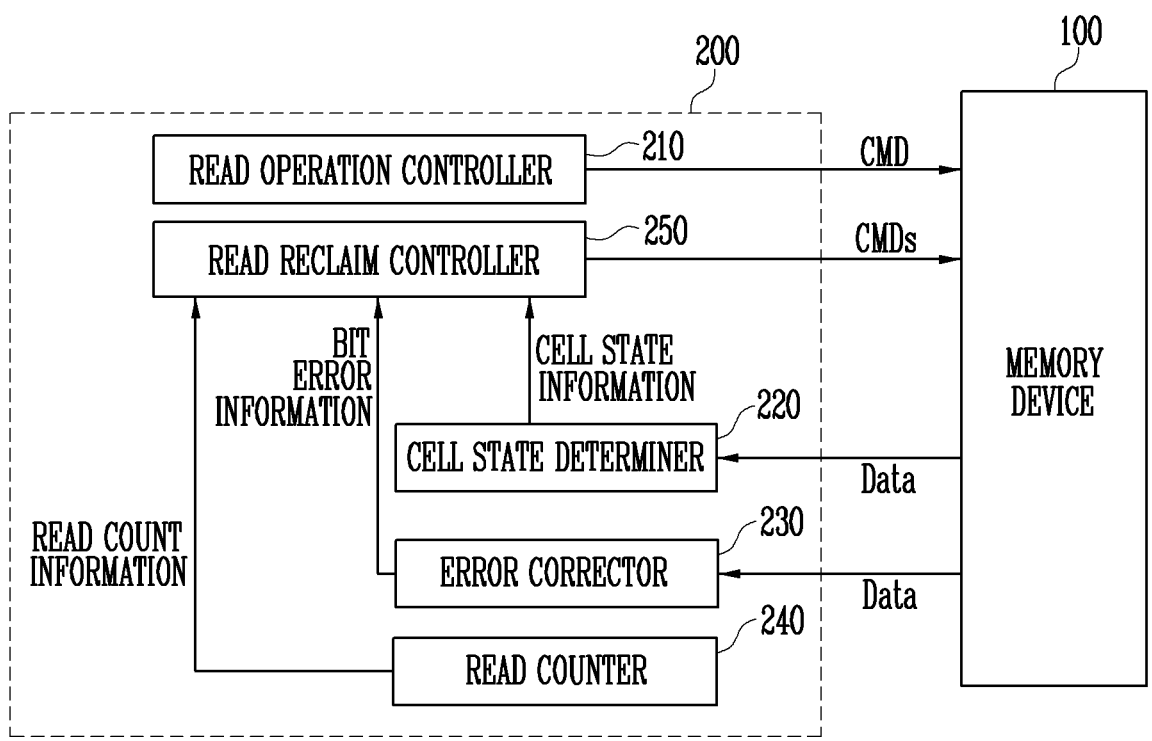

FIG. 8 is a diagram illustrating a configuration and an operation of a memory controller shown in FIG. 1 in accordance with an embodiment of the present disclosure.

Figure 9:
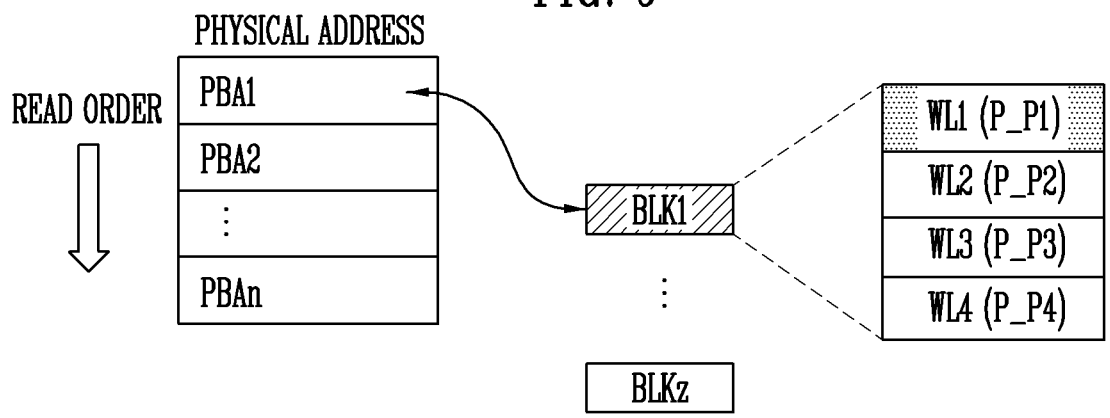

FIG. 9 is a diagram illustrating a read operation controlled by a read operation controller shown in FIG. 8 in accordance with an embodiment of the present disclosure.

Figure 10:
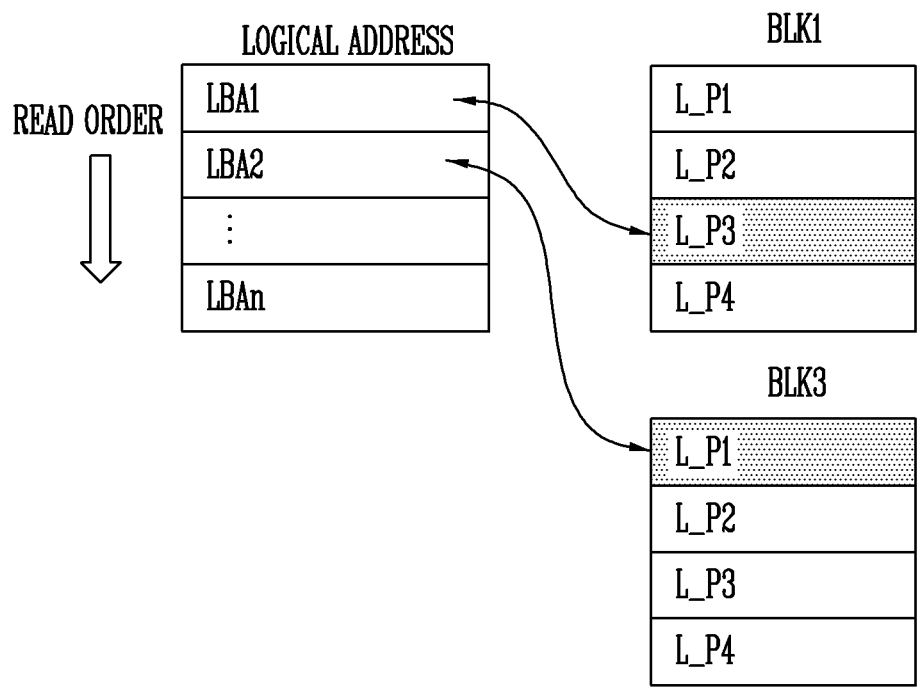

FIG. 10 is a diagram illustrating a read operation controlled by a read operation controller shown in FIG. 8 in accordance with another embodiment of the present disclosure.

Figure 11:
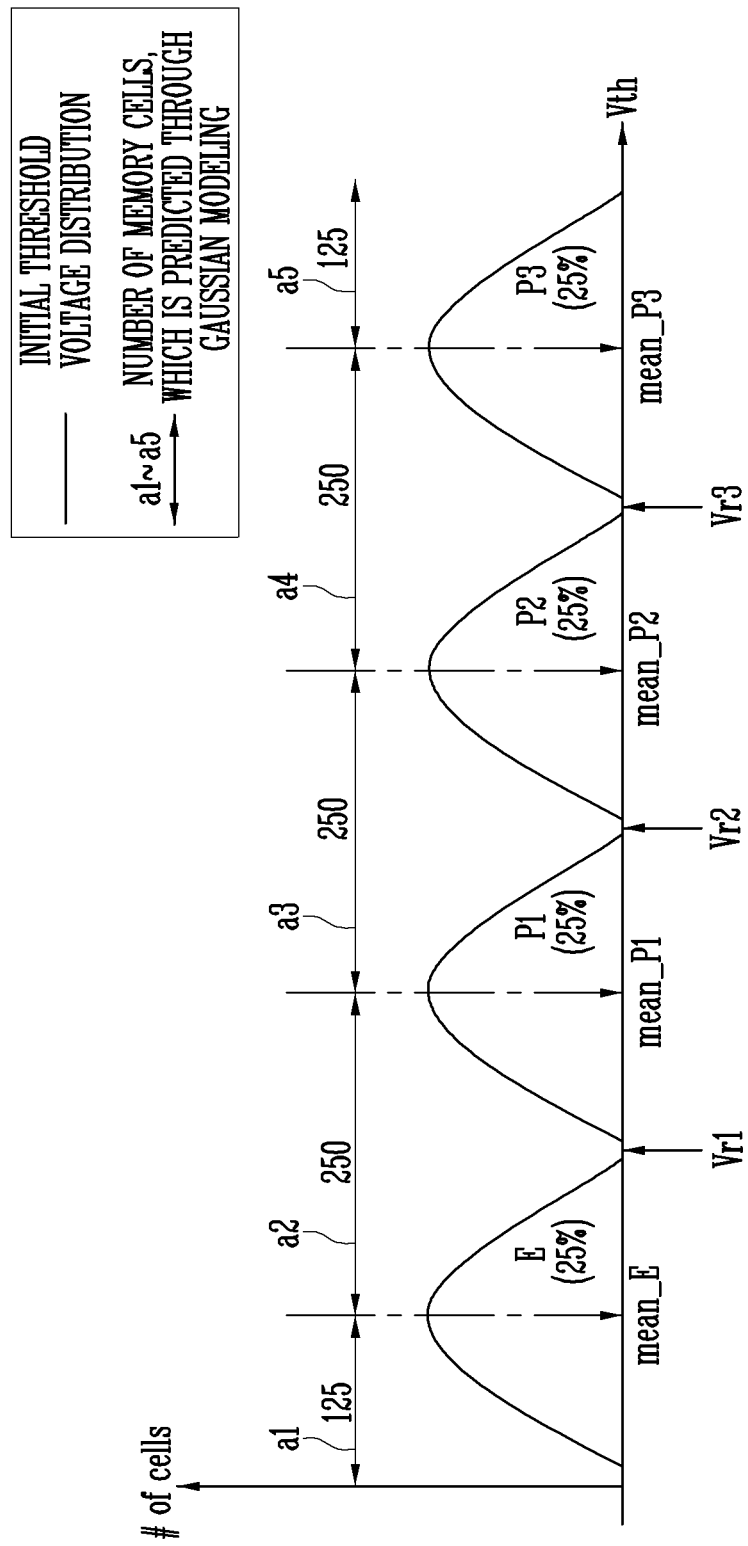

FIG. 11 is a diagram illustrating an initial threshold voltage distribution.

Figure 12:
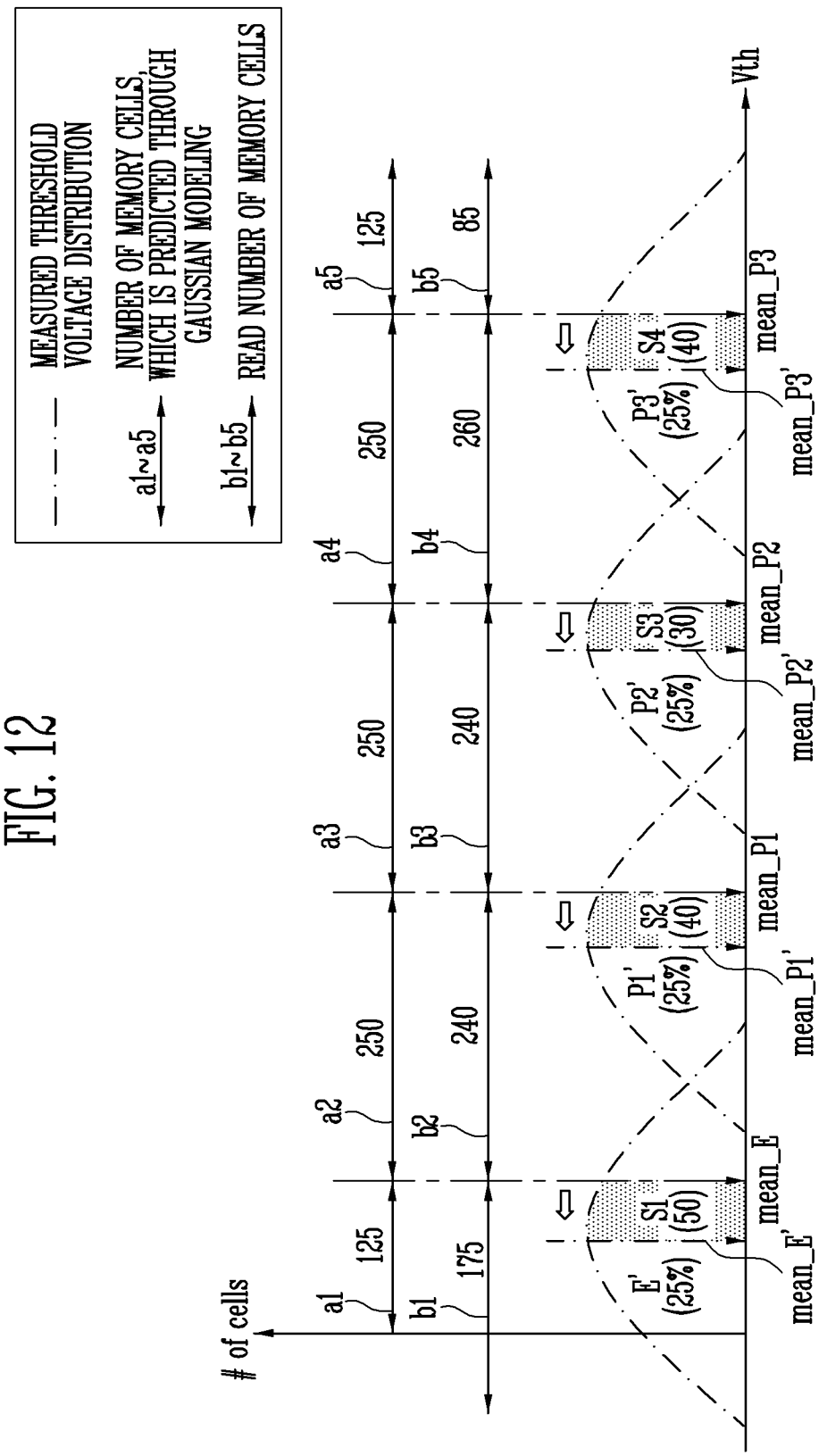

FIG. 12 is a diagram illustrating a measured threshold voltage distribution shifted to the left.

FIG. 13 is a diagram illustrating a calculation of memory cell degradation degrees, based on FIG. 12.

Figure 14:
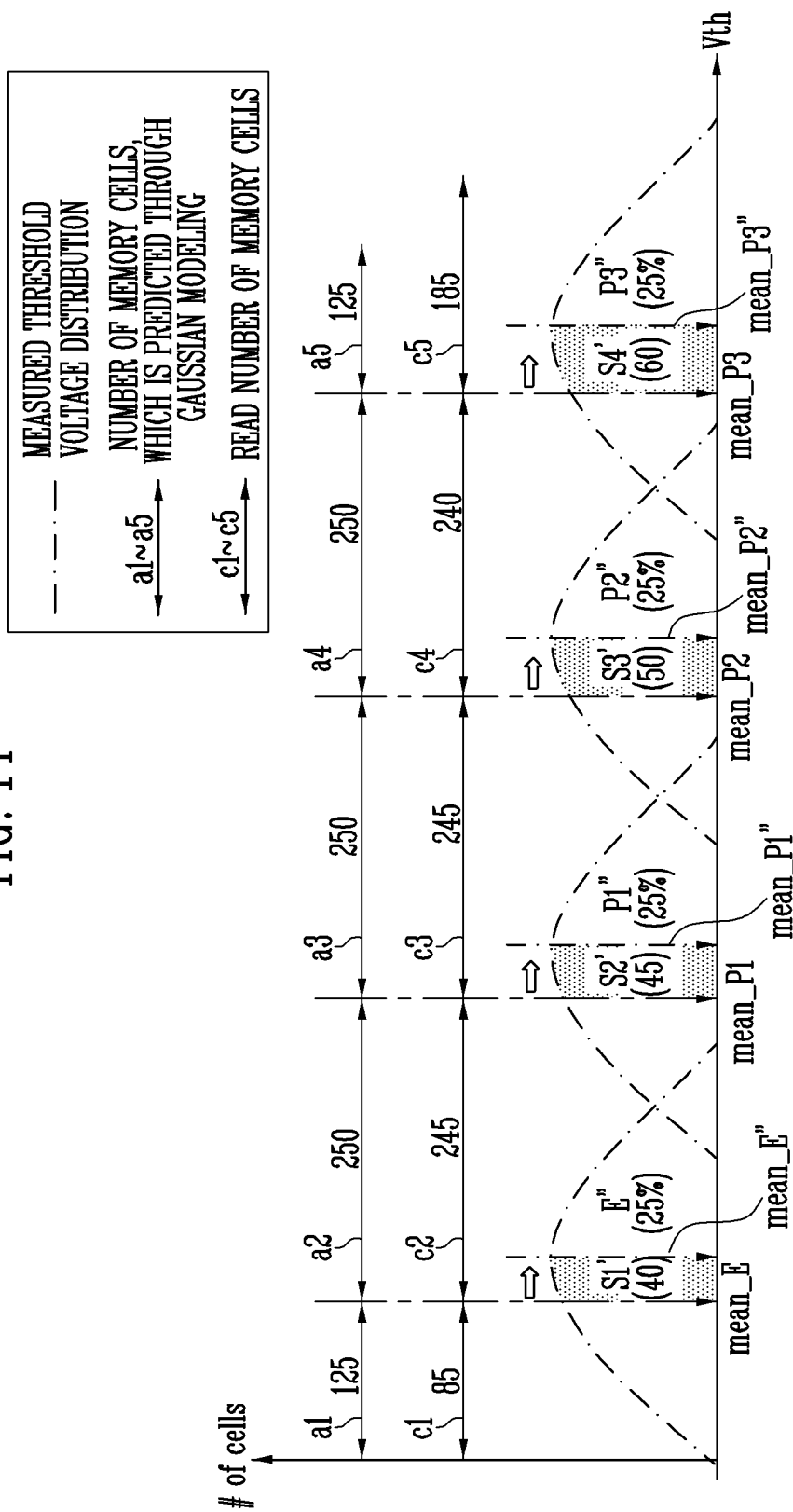

FIG. 14 is a diagram illustrating a measured threshold voltage distribution shifted to the right.

FIG. 15 is a diagram illustrating a calculation of memory cell degradation degrees, based on FIG. 14.

FIG. 16 is a diagram illustrating conditions for performing a read reclaim operation in accordance with an embodiment of the present disclosure.

FIG. 17 is a diagram illustrating conditions for performing a read reclaim operation in accordance with an embodiment of the present disclosure.

Figure 18:
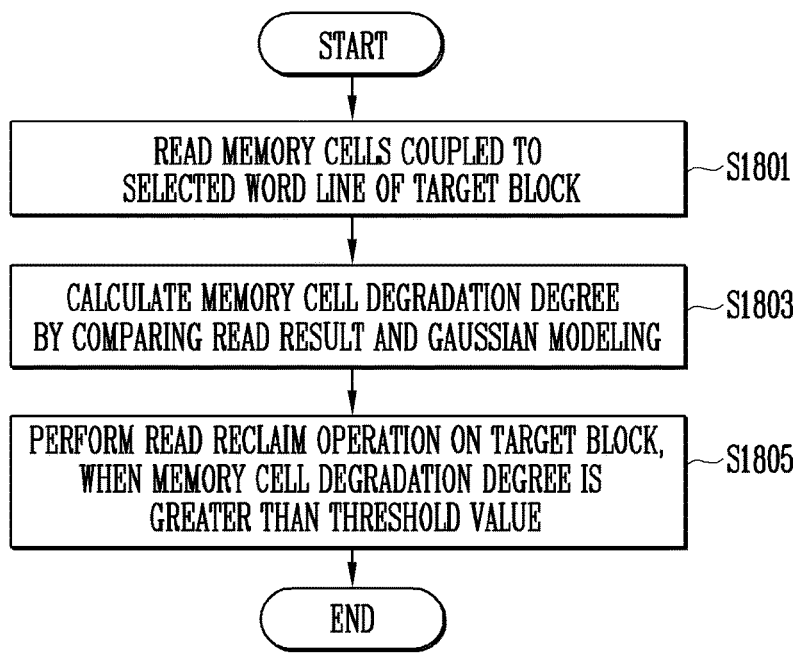

FIG. 18 is a flowchart illustrating an operation of a storage device in accordance with an embodiment of the present disclosure.

Figure 19:
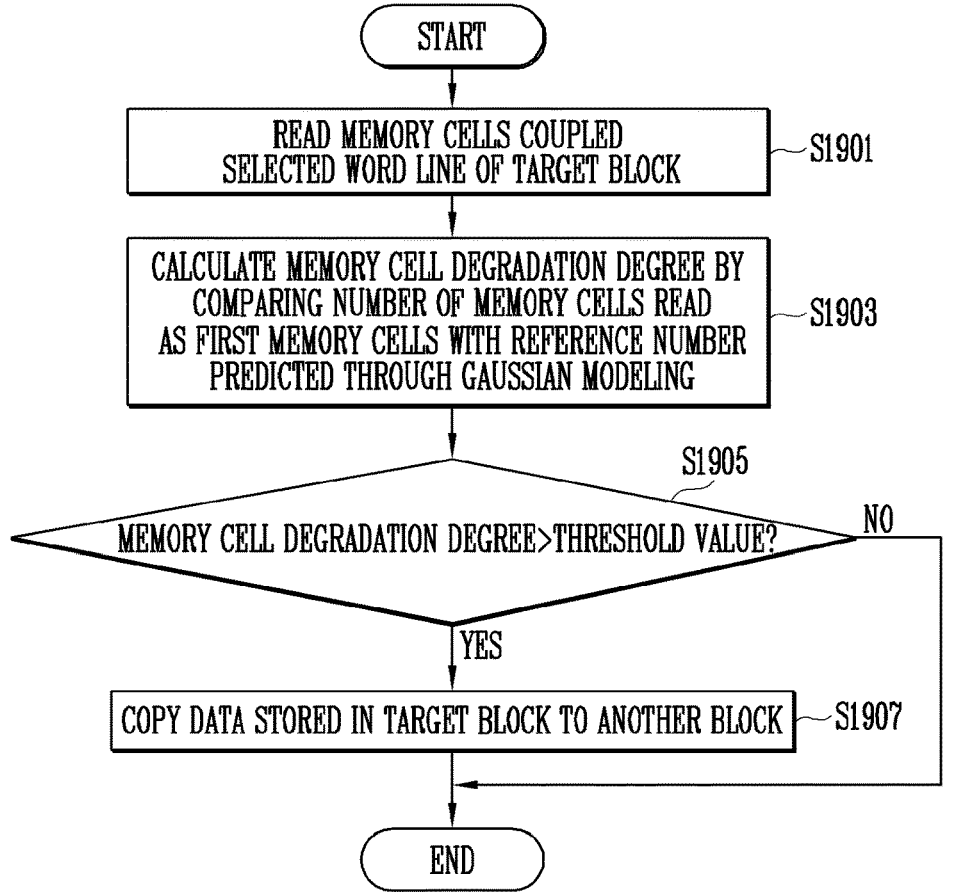

FIG. 19 is a flowchart illustrating FIG. 18 with additional detail.

Figure 20:
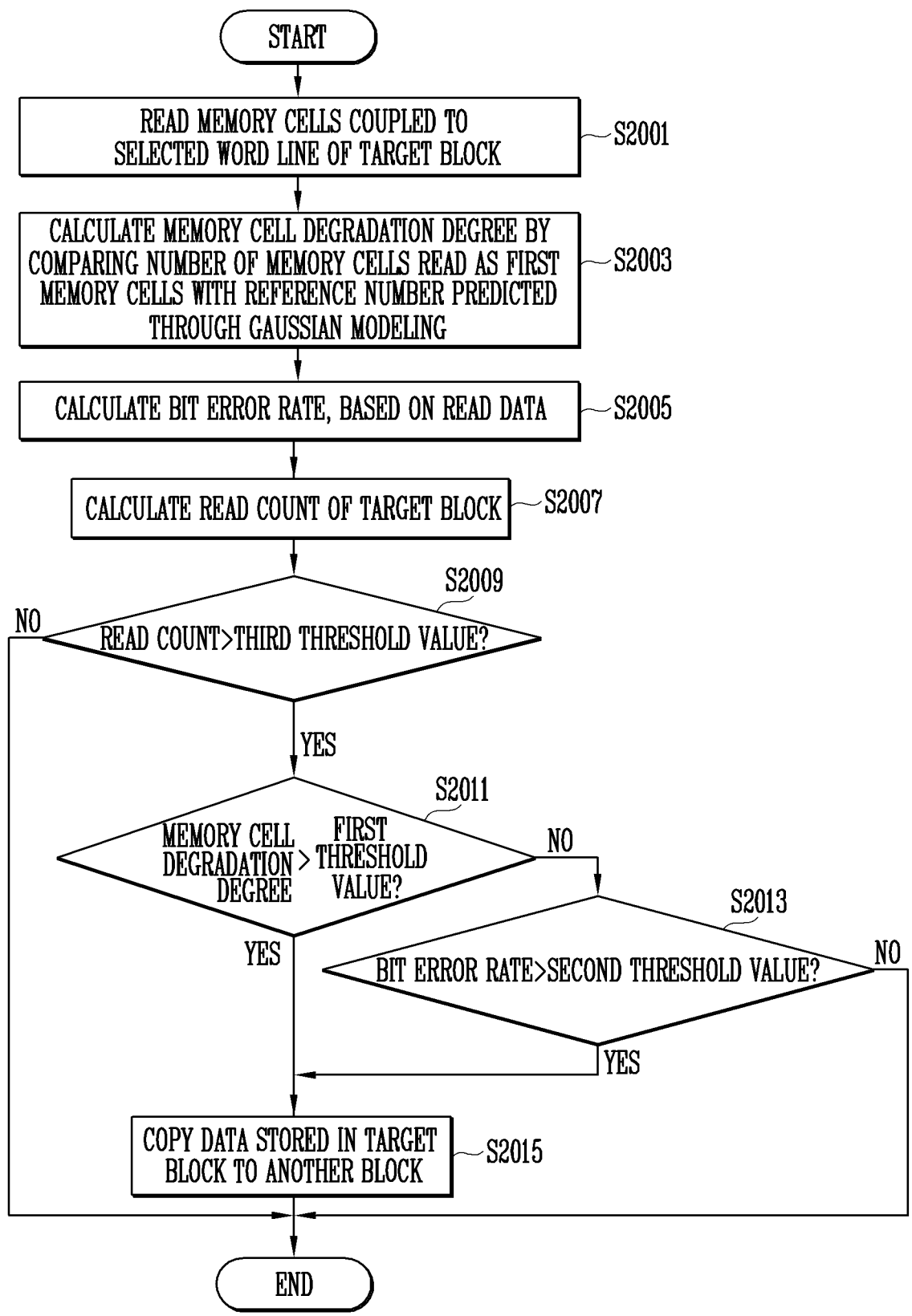

FIG. 20 is a flowchart illustrating an operation of a storage device in accordance with another embodiment of the present disclosure.

Figure 21:
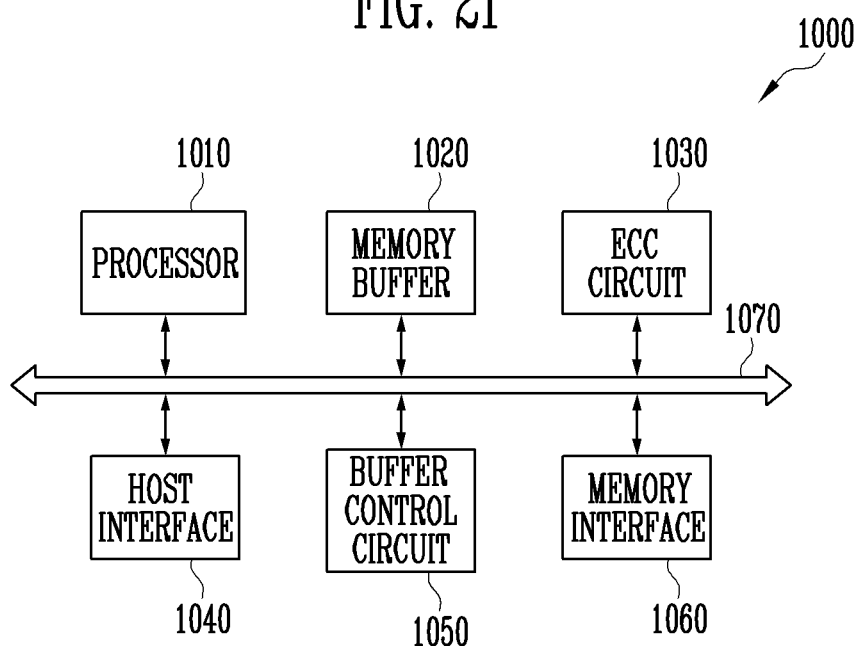

FIG. 21 is a diagram illustrating another embodiment of a memory controller shown in FIG. 1.

Figure 22:
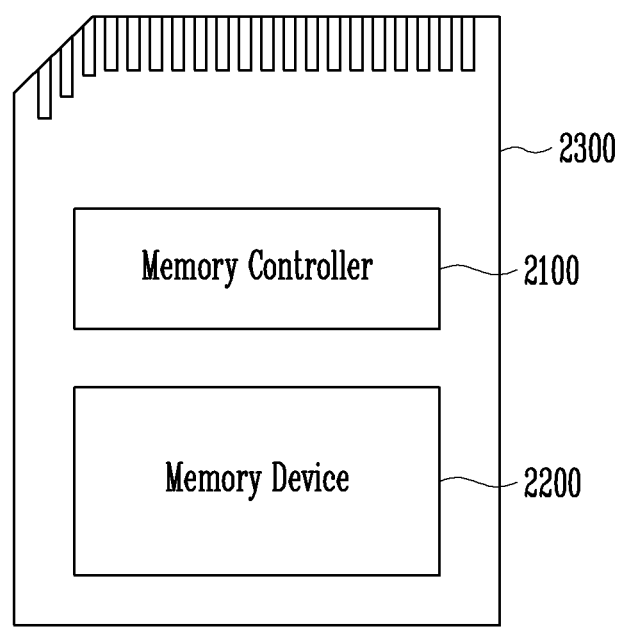

FIG. 22 is a block diagram illustrating a memory card system to which a storage device is applied in accordance with an embodiment of the present disclosure.

Figure 23:
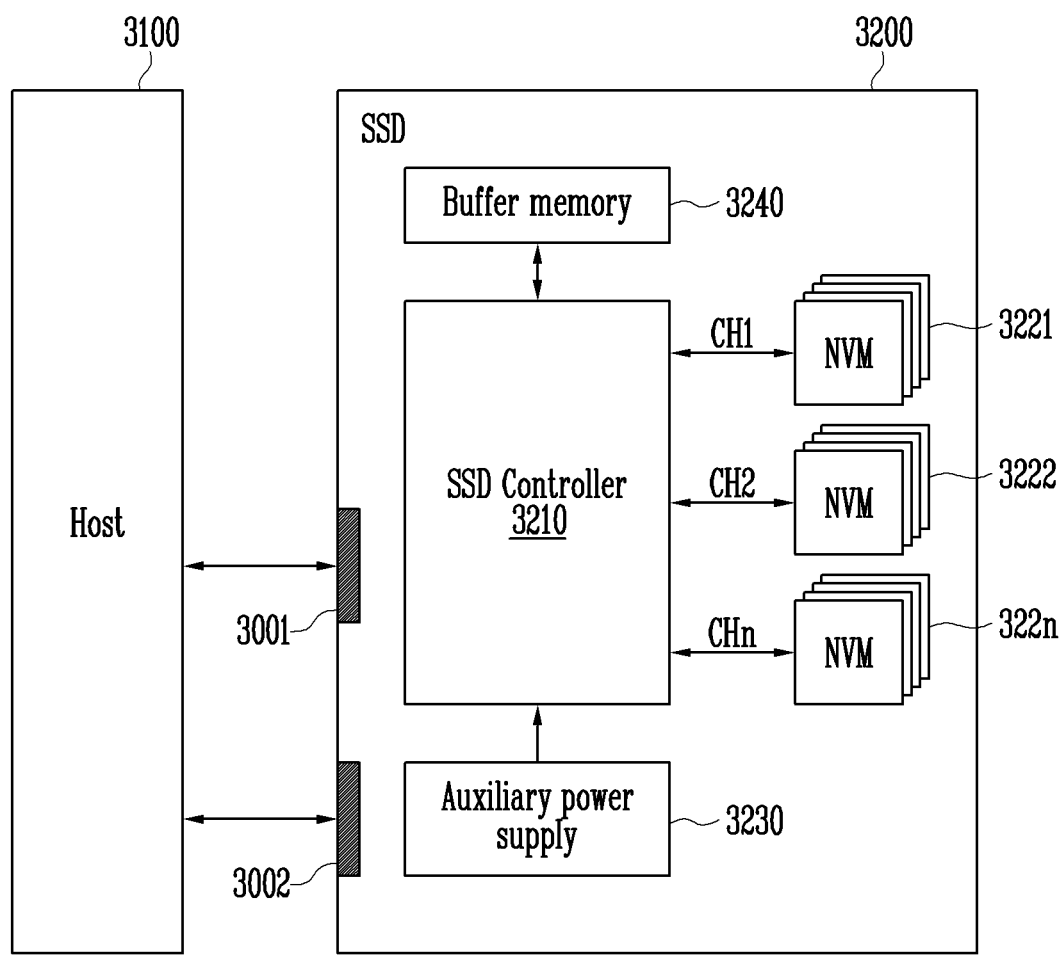

FIG. 23 is a block diagram exemplarily illustrating a Solid State Drive (SSD) system to which a storage device is applied in accordance with an embodiment of the present disclosure.

Figure 24:
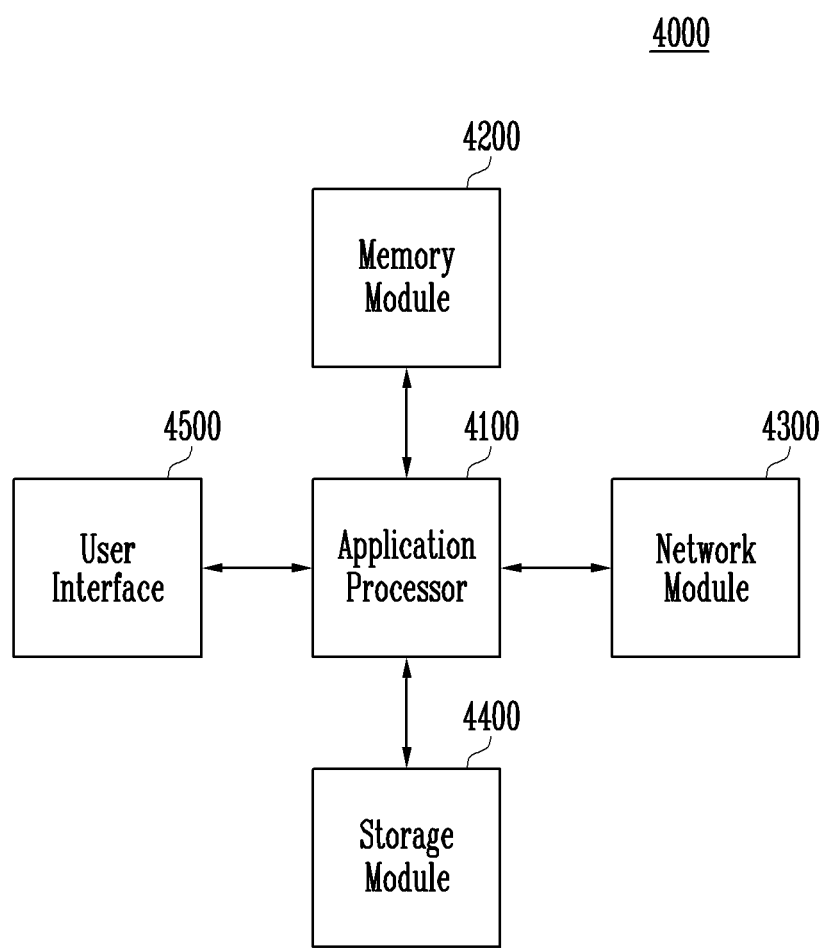

FIG. 24 is a block diagram illustrating a user system to which a storage device is applied in accordance with an embodiment of the present disclosure.

DETAILED DESCRIPTION

Hereinafter, exemplary embodiments of the present disclosure will be described in detail with reference to the accompanying drawings.

FIG. 1 is a diagram illustrating a storage device in accordance with an embodiment of the present disclosure.

Referring to FIG. 1, the storage device 50 may include a memory device 100 and a memory controller 200 configured to control an operation of the memory device 100. The storage device 50 may be a device for storing data under the control of a host 300, such as a mobile phone, a smart phone, an MP3 player, a laptop computer, a desktop computer, a game console, a TV, a tablet PC or an in-vehicle infotainment as non-limiting examples.

The storage device 50 may be manufactured as any one of various types of storage devices according to a host interface that is a communication scheme with the host 300. For example, the storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP) as non-limiting examples.

The memory device 100 may store data. The memory device 100 operates under the control of the memory controller 200. In an example, the memory device 100 may include a memory cell array including a plurality of memory cells for storing data.

Each of the plurality of memory cells may be configured as a Single Level Cell (SLC) for storing one data bit, a Multi-Level Cell (MLC) for storing two data bits, a Triple Level Cell (TLC) for storing three data bits, or a Quad Level Cell (QLC) for storing four data bits.

The memory cell array may include a plurality of memory blocks. Each memory block may include a plurality of memory cells. One memory block may include a plurality of pages. In an embodiment, a page may be a unit for storing data in the memory device 100 or for reading data stored in the memory device 100.

More specifically, the memory block may include a plurality of word lines. A plurality of memory cells are coupled to each word line. Memory cells coupled to the same word line may be defined as one physical page. Depending on the number of data bits stored by a memory cell, at least one logical page may correspond to one physical page.

For example, when a memory cell is a single level cell for storing one data bit, one logical page may correspond to one physical page. When a memory cell is a multi-level cell for storing two data bits, two logical pages may correspond to one physical page. The two logical pages may be a Most Significant Bit (MSB) page for storing MSB data and a Least Significant Bit (LSB) page for storing LSB data.

The memory block may be a unit for erasing data. In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is assumed and described.

The memory device 100 receives a command and an address from the memory controller 200 and accesses an area selected by the address in the memory cell array. That is, the memory device 100 may perform an operation instructed by the command on the area selected by the address. For example, the memory device 100 may perform a write (program) operation, a read operation, and an erase operation. In a program operation, the memory device 100 may program data in the area selected by the address. In a read operation, the memory device 100 may read data from the area selected by the address. In an erase operation, the memory device 100 may erase data stored in the area selected by the address.

The memory controller 200 may control overall operations of the storage device 50.

When power is applied to the storage device 50, the memory controller 200 may execute firmware (FW). When the memory device 100 is a flash memory device, the memory controller 200 may execute FW such as a Flash Translation Layer (FTL) for controlling communication between the host 300 and the memory device 100.

In an embodiment, the memory controller 200 may receive data and a Logical Block Address (LBA) from the host 300, and translate the LBA into a Physical Block Address (PBA) representing addresses of memory cells included in memory device 100 in which data is to be stored.

The memory controller 200 may control the memory device 100 to perform a program operation, a read operation, an erase operation, or the like in response to a request from the host 300. In the program operation, the memory controller 200 may provide a program command, a PBA, and data to the memory device 100. In a read operation, the memory controller 200 may provide a read command and a PBA to the memory device 100. In an erase operation, the memory controller 200 may provide an erase command and a PBA to the memory device 100.

In an embodiment, the memory controller 200 may autonomously generate a command, an address, and data in the absence of a request from the host 300, and transmit the command, the address, and the data to the memory device 100. For example, the memory controller 200 may provide the command, the address, and the data to the memory device 100 to perform background operations such as a program operation for wear leveling or a program operation for garbage collection.

In an embodiment, a memory controller 200 may control at least two memory devices 100. The memory controller 200 may control the memory devices according to an interleaving scheme so as to improve operational performance. The interleaving scheme may be an operating scheme that allows operating sections of at least two memory devices 100 to overlap or alternate with each other.

In an embodiment, a memory controller 200 may include a read operation controller 210, a cell state determiner 220, and a read reclaim controller 250.

The read operation controller 210 may control the memory device 100 to read a selected page by using at least one reference voltage among a plurality of reference voltages.

In an embodiment, the selected page may be a physical page configured with memory cells coupled to a selected word line of a target block. The read operation controller 210 may control the memory device 100 to sequentially read physical pages included in all the memory blocks of the memory device 100.

In another embodiment, the selected page may be a logical page corresponding to the physical page configured with memory cells coupled to the selected word line of the target block. The read operation controller 210 may control the memory device 100 to sequentially read logical pages corresponding to all logical addresses at which data is stored.

In an embodiment, the memory cells coupled to the selected word line have a plurality of reference voltages which may be default read voltages for distinguishing among an erase state and a plurality of program states. The total number of the erase state and the plurality of program states may be determined according to a number of data bits stored by each of the memory cells coupled to the selected word line.

In another embodiment, memory cells coupled to the selected word line may be in an erase state or a plurality of program states, and each of the plurality of reference voltages may be a mean voltage of an initial threshold voltage distribution that corresponds to each of the erase state and the plurality of program states. The initial threshold voltage distribution may be a threshold voltage distribution that the memory cells have in a state before memory cell degradation occurs. Alternatively, each of the plurality of reference voltages may be a mean voltage of two adjacent default read voltages. The mean voltage of a threshold voltage distribution may be a voltage at a point (peak) at which the number of memory cells in the threshold voltage distribution is greatest.

The read operation controller 210 may control the memory device 100 to read a selected page in response to a request from the host 300. Alternatively, the read operation controller 210 may control the memory device 100 to read a selected page to perform a background operation, even without a request from the host 300. That is, when the memory device 100 is in an idle state, the read operation controller 210 may control the memory device 100 to read a selected page to perform a background operation. The idle state may be a state in which the memory device 100 does not perform any operation in response to a request from the host 300.

The cell state determiner 220 may generate cell state information representing degree degradation of a memory cell, based on read data received from the memory device 100.

Among selected memory cells coupled to a selected word line, the cell state determiner 220 may calculate a number of memory cells read as first memory cells using at least one reference voltage among the plurality of reference voltages. The first memory cell may be any one of an on-cell or an off-cell.

The cell state determiner 220 may calculate a memory cell degradation degree, based on a difference value between the number of memory cells read as the first memory cells and a reference number, from among a plurality of reference numbers, corresponding to at least one reference voltage. The plurality of reference numbers may be determined based on the number of selected memory cells and the plurality of reference voltages. The cell state determiner 220 may calculate a memory cell degradation degree corresponding to one state among a plurality of states for the selected memory cells.

In various embodiments contemplated by this disclosure, a reference number corresponding to any one reference voltage may be a number of memory cells, predicted through Gaussian modeling using a reference voltage from among selected memory cells having an initial threshold voltage distribution, to be read as the first memory cells.

The read reclaim controller 250 may control the memory device 100 to perform a read reclaim operation of copying data stored in a target block to another block (except for the target block), according to a result obtained by comparing a sample value, determined based on at least one memory cell degradation degree, with a first threshold value. The first threshold value may be a threshold degradation degree for determining whether the memory cell degradation degree is within a normal range. The read reclaim controller 250 may determine, as the sample value, any one of a minimum value, a mean value, an intermediate value, and a maximum value of the at least one memory cell degradation degree.

When the sample value is greater than the first threshold value, the read reclaim controller 250 may control the memory device 100 to perform the read reclaim operation on the target block. On the contrary, when the sample value is smaller than or equal to the first threshold value, the read reclaim controller 250 may prevent the memory device 100 from performing any read reclaim operation on the target block.

In another embodiment, the read reclaim controller 250 may control the memory device 100 to perform a read reclaim operation on a target block according to a result obtained by comparing a bit error rate, of data read by memory cells coupled to a selected word line, with a second threshold value. The second threshold value may be a threshold error rate for determining whether the bit error rate is within a normal range.

Specifically, when the bit error rate is greater than the second threshold value, the read reclaim controller 250 may control the memory device 100 to perform the read reclaim operation on the target block. On the contrary, when the bit error rate is smaller than or equal to the second threshold value, the read reclaim controller 250 may control the memory device 100 not to perform the read reclaim operation on the target block.

In another embodiment, a read reclaim controller 250 may control a memory device 100 to perform the read reclaim operation on the target block, based on a result obtained by comparing a read count, obtained by counting a number of times a read operation on the target block is performed, with a third threshold value.

Specifically, when the read count of the target block is greater than the third threshold value, the read reclaim controller 250 may control the memory device 100 to perform the read reclaim operation on the target block, but subject to results obtained by comparing the sample value with the first threshold value and by comparing the bit error rate with the second threshold value. The third threshold value may be a threshold count for determining whether the read count is within a normal range.

Therefore, when the sample value is smaller than or equal to the first threshold value and the bit error rate is smaller than or equal to the second threshold value, even though the read count of the target block is greater than the third threshold value, the read reclaim controller 250 may control the memory device 100 so that the read reclaim operation is not performed on the target block.

Accordingly, the read reclaim controller 250 can control the memory device 100 to prevent an unnecessary read reclaim operation on a memory block if a read count exceeds a threshold value, but the degradation degree and bit error rate of memory cells are respectively equal to or smaller than threshold values.

The host 300 may communicate with the storage device 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

FIG. 2 is a diagram illustrating a structure of the memory device shown in FIG. 1.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are coupled to an address decoder 121 through row lines RL. The plurality of memory blocks BLK1 to BLKz are coupled to a read/write circuit 123 through bit lines BL1 to BLm. Each of the plurality of memory blocks BLK1 to BLKz includes a plurality of memory cells. In an embodiment, the plurality of memory cells may be nonvolatile memory cells. Memory cells coupled to the same word line may be defined as one physical page. That is, the memory cell array 110 may be configured with a plurality of physical pages. In accordance with an embodiment of the present disclosure, each of the plurality of memory blocks BLK1 to BLKz included in the memory cell array 110 may include a plurality of dummy cells. One or more dummy cells may be coupled in series between a drain select transistor and the memory cells, and between a source select transistor and the memory cells.

Each of the memory cells of the memory device may be configured as a Single Level Cell (SLC) for storing one data bit, a Multi-Level Cell (MLC) for storing two data bits, a Triple Level Cell (TLC) for storing three data bits, or a Quad Level Cell (QLC) for storing four data bits.

The peripheral circuit 120 may include the address decoder 121, a voltage generator 122, the read/write circuit 123, a data input/output circuit 124, and a sensing circuit 125.

The peripheral circuit 120 drives the memory cell array 110. For example, the peripheral circuit 120 may drive the memory cell array 110 to perform a program operation, a read operation, and an erase operation.

The address decoder 121 is coupled to the memory cell array 110 through the row lines RL. The row lines RL may include drain select lines, word lines, source select lines, and a common source line. In accordance with an embodiment of the present disclosure, the word lines may include normal word lines and dummy word lines. In accordance with a further embodiment of the present disclosure, the row lines RL may further include a pipe select line.

The address decoder 121 may operate under the control of the control logic 130. The address decoder 121 receives an address ADDR from the control logic 130.

The address decoder 121 may decode a block address in the received address ADDR. The address decoder 121 selects at least one memory block from among the memory blocks BLK1 to BLKz according to the decoded block address. The address decoder 121 may decode a row address in the received address ADDR.

The address decoder 121 may select at least one word line of the selected memory block by applying voltages provided from the voltage generator 122 to the word line WL, and according to the decoded row address.

In a program operation, the address decoder 121 may apply a program voltage to the selected word line, and apply a pass voltage having a level lower than that of the program voltage to unselected word lines. In a program verify operation, the address decoder 121 may apply a verify voltage to the selected word line, and apply a verify pass voltage having a level higher than that of the verify voltage to the unselected word lines.

In a read operation, the address decoder 121 may apply a read voltage to the selected word line, and apply a read pass voltage having a level higher than that of the read voltage to the unselected word lines.

In accordance with an embodiment of the present disclosure, an erase operation of the memory device 100 is performed in units of memory blocks. In an erase operation, the address ADDR input to the memory device 100 includes a block address. The address decoder 121 may decode the block address and select one memory block according to the decoded block address. In the erase operation, the address decoder 121 may apply a ground voltage to word lines coupled to the selected memory block.

In accordance with an embodiment of the present disclosure, the address decoder 121 may decode a column address in the address ADDR transmitted thereto. The decoded column address may be transmitted to the read/write circuit 123. In an example, the address decoder 121 may include components such as a row decoder, a column decoder, and an address buffer.

The voltage generator 122 may generate a plurality of operating voltages Vop by using an external power voltage supplied to the memory device 100. The voltage generator 122 operates under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of operating voltages Vop by using the external power voltage or the internal power voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

In order to generate a plurality of operating voltages Vop having various voltage levels, the voltage generator 122 may include a plurality of pumping capacitors for receiving the internal power voltage, and generate the plurality of operating voltages Vop by selectively activating the plurality of pumping capacitors under the control of the control logic 130.

The plurality of generated voltages Vop may be supplied to the memory cell array 110 by the address decoder 121.

The read/write circuit 123 includes first to mth page buffers PB1 to PBm. The first to mth page buffers PB1 to PBm are coupled to the memory cell array 110 through the respective first to mth bit lines BL1 to BLm. The first to mth page buffers PB1 to PBm operate under the control of the control logic 130.

The first to mth page buffers PB1 to PBm communicate data DATA with the data input/output circuit 124. In a program operation, the first to mth page buffers PB1 to PBm receive data DATA to be stored through the data input/output circuit 124 and data lines DL.

In a program operation, the first to mth page buffers PB1 to PBm may transfer, to selected memory cells through the bit lines BL1 to BLm, data DATA received through the data input/output circuit 124 when a program pulse is applied to a selected word line. The selected memory cells are programmed according to the transferred data DATA. A memory cell coupled to a bit line through which a program allowance voltage (e.g., a ground voltage) is applied may have an increased threshold voltage. A threshold voltage of a memory cell coupled to a bit line through which a program inhibit voltage (e.g., a power voltage) is applied may be maintained at the same or substantially same voltage. In a program verify operation, the first to mth page buffers PB1 to PBm read data DATA stored in the selected memory cells from the selected memory cells through the bit lines BL1 to BLm.

In a read operation, the read/write circuit 123 may read data DATA from memory cells of a selected page through the bit lines BL, and store the read data DATA in the first to mth page buffers PB1 to PBm.

In an erase operation, the read/write circuit 123 may float the bit lines BL. In an embodiment, the read/write circuit 123 may include a column select circuit.

The data input/output circuit 124 is coupled to the first to mth page buffers PB1 to PBm through the data lines DL. The data input/output circuit 124 operates under the control of the control logic 130.

The data input/output circuit 124 may include a plurality of input/output buffers that receive input data DATA. The data input/output circuit 124 may receive data DATA from an external controller (not shown) or output data DATA to the external controller in response to a data input/output circuit control signal IOSIGNALS In a program operation, the data input/output circuit 124 may receive data DATA to be stored from an external controller. In a read operation, the data input/output circuit 124 outputs, to an external controller, data transmitted from the first to mth page buffers PB1 to PBm included in the read/write circuit 123.

In a verify operation, the sensing circuit 125 may generate a reference current in response to a verify control signal VRYSIGNALS generated by the control logic 130, and output a pass signal or fail signal to the control logic 130 by comparing a sensing voltage VPB received from the read/write circuit 123 and a reference voltage generated by the reference current.

The control logic 130 may be coupled to the address decoder 121, the voltage generator 122, the read/write circuit 123, the data input/output circuit 124, and the sensing circuit 125. The control logic 130 may control overall operations of the memory device 100. The control logic 130 may operate in response to a command CMD transferred from an external device.

The control logic 130 may control the peripheral circuit 120 by generating several signals in response to a command CMD and an address ADDR. For example, the control logic 130 may generate an operation signal OPSIG, a read/write circuit control signal PBSIGNALS, a data input/output circuit control signal IOSIGNALS, and a verify control signal VRYSIGNALS in response to the command CMD and the address ADDR. The control logic 130 may output the operation signal OPSIG to the voltage generator 122, output the input address ADDR to the address decoder 121, output the read/write circuit control signal PBSIGNALS to the read/write circuit 123, output the a data input/output circuit control signal IOSIGNALS to the data input/output circuit 124 and output the verify control signal VRYSIGNALS to the sensing circuit 125. Also, the control logic 130 may determine whether the verify operation has passed or failed in response to the pass or fail signal PASS/FAIL output by the sensing circuit 125.

FIG. 3 is a diagram illustrating an embodiment of a memory cell array shown in FIG. 2.

Referring to FIG. 3, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 4 and 5.

FIG. 4 is a circuit diagram illustrating any one memory block BLKa among the memory blocks BLK1 to BLKz shown in FIG. 3.

Referring to FIG. 4, arbitrary memory block BLKa may include a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction (i.e., a +X direction). FIG. 4 illustrates two cell strings arranged in a column direction (i.e., a +Y direction). However, this is for convenience of description, and it will be understood, for example, that three or more than three cell strings may be arranged in the column direction.

Each of the plurality of cell strings CS11 to CS1m and CS21 to CS2m may include at least one source select transistor SST, first to nth memory cells MC1 to MCn, a pipe transistor PT, and at least one drain select transistor DST.

The select transistors SST and DST, and the memory cells MC1 to MCn, may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar including the channel layer may be included in each cell string. In an embodiment, in each cell string, a pillar for providing at least one of the channel layer, the tunneling insulating layer, the charge storage layer, and the blocking insulating layer may be provided.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 4, for example, the source select transistors of the cell strings CS11 to CS1m on a first row are coupled to a first source select line SSL1. The source select transistors of the cell strings CS21 to CS2m on a second row are coupled to a second source select line SSL2.

In another embodiment, the source select transistors of the cell strings CS11 to CS1m and CS21 to CS2m may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite, downward direction (−Z direction), and are coupled in series between the source select transistor SST and the pipe transistor PT. The (p+1)th to nth memory cells MCp+1 to MCn are sequentially arranged an upward (+Z) direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1m on the first row are coupled to a first drain select line DSL1. The drain select transistors of the cell strings CS21 to CS2m on the second row are coupled to a second drain select line DSL2.

Cell strings arranged in the column direction are coupled to a bit line extending in the column direction. In FIG. 4, for example, the cell strings CS11 and CS21 on a first column are coupled to a first bit line BL1. The cell strings CS1m and CS2m on an mth column are coupled to an mth bit line BLm.

Memory cells coupled to the same word line in the cell strings, and arranged in the row direction, constitute one page. For example, memory cells coupled to the first word line WL1 in the cell strings CS11 to CS1m on the first row constitute one page. Memory cells coupled to the first word line WL1 in the cell strings CS21 to CS2m on the second row constitute another page. If one of the drain select lines DSL1 and DSL2 is selected, then cell strings arranged in one row direction may be selected. If one of the word lines WL1 to WLn is selected, then one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m, and arranged in the row direction, may be coupled to the even bit lines, respectively, while odd-numbered cell strings among the cell strings CS11 to CS1m or CS21 to CS2m that are arranged in the row direction may be coupled to the odd bit lines, respectively.

In an embodiment, at least one of the first to nth memory cells MC1 to MCn may be used as a dummy memory cell. For example, at least one dummy memory cell may be provided to decrease an electric field between the source select transistor SST and the memory cells MC1 to MCp. Alternatively, the dummy memory cell may be used to decrease an electric field between the drain select transistor DST and the memory cells MCp+1 to MCn. As the number of dummy memory cells increases, the reliability of an operation of a memory block BLKa is improved. On the other hand, the size of the memory block BLKa increases. If the number of dummy memory cells decreases, then the size of the memory block BLKa decreases, however, the reliability of an operation of the memory block BLKa may deteriorate.

Efficient control of dummy memory cells requires the dummy memory cells to have a predetermined threshold voltage. Before or after an erase operation of the memory block BLKa, a program operation may be performed on all or some of the dummy memory cells. If an erase operation is performed after the program operation is performed, then the required threshold voltage of the dummy memory cells for controlling a voltage applied to the dummy word lines coupled to the respective dummy memory cells can be preset.

FIG. 5 is a circuit diagram illustrating another embodiment in which an arbitrary memory block BLKb is described among the memory blocks BLK1 to BLKz shown in FIG. 3.

Referring to FIG. 5, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) located under the memory block BLKb.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line 55L2. In another embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Consequently, the memory block BLKb of FIG. 5 has a circuit similar to that of the memory block BLKa of FIG. 4, except that the pipe transistor PT is excluded from each cell string in FIG. 5.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be coupled to the even bit lines, respectively, and odd-numbered cell strings among the cell strings CS11' to CS1m' or CS21' to CS2m' arranged in the row direction may be coupled to the odd bit lines, respectively.

In an embodiment, at least one of the first to nth memory cells MC1 to MCn may be used as a dummy memory cell. For example, the dummy memory cell may be provided to decrease an electric field between the source select transistor SST and the memory cells MC1 to MCn. Alternatively, the at least one dummy memory cell may be provided to decrease an electric field between the drain select transistor DST and the memory cells MC1 to MCn. When the number of dummy memory cells increases, the reliability of an operation of the memory block BLKb is improved, but the size of the memory block BLKb is increased. When the number of dummy memory cells decreases, the size of the memory block BLKb decreases, however, the reliability of an operation of the memory block BLKb may deteriorate.

In order to efficiently control the at least one dummy memory cell, the dummy memory cells may have a required or predetermined threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

FIG. 6 is a diagram illustrating a threshold voltage distribution of memory cells and logical page data.

Referring to FIG. 6, the horizontal axis of each graph represents magnitudes of threshold voltages, and the vertical axis of each graph represents numbers of memory cells.

Referring to a threshold voltage distribution of a Single Level Cell (SLC) for storing one data bit, the SLC may have any one of an erase state E or a program state P1.

A read voltage Va1 may be a read voltage for distinguishing memory cells with erase state E from those with program state P1. An SLC having the erase state E may be read as an on-cell, when the SLC is read using the read voltage Va1. Data corresponding to the on-cell may be logic value '1.' An SLC having the program state P1 may be read as an off-cell, when the SLC is read using the read voltage Va1. Data corresponding to the off-cell may be logic value '0.' In another embodiment, the data corresponding to the on-cell may be the logic value '0', and the data corresponding to the off-cell may be the logic value '1.'

In FIG. 6, referring to a threshold voltage distribution of a Multi-Level Cell (MLC) for storing two data bits, an MLC may have any one of an erase state E and first to third program states P1 to P3.

First to third read voltages Vb1 to Vb3 may be read voltages for distinguishing memory cells respectively belonging to the erase state E and the first to third program states P1 to P3. The first read voltage Vb1 may be a read voltage for distinguishing memory cells respectively belonging to the erase state E and the first program state P1. The second read voltage Vb2 may be a read voltage for distinguishing between memory cells respectively belonging to the first program state P1 and the second program state P2. The third read voltage Vb3 may be a read voltage for distinguishing memory cells having the second program state P2 from those having the third program state P3.

An MLC may have any one of the erase state E and the first to third program states P1 to P3, based on a result obtained by reading the MLC using the first to third read voltages Vb1 to Vb3.

The erase state E and the first to third program states P1 to P3 may correspond to logic data '11,' '01,' '00,' and '10,' respectively. The logic data corresponding to each state is not limited to this example, and other combinations are within the scope of this disclosure.

MLCs commonly coupled to one word line may constitute one physical page. Since the MLC stores two data bits, two logical pages may correspond to one physical page. A logical page for storing an MSB (Most Significant Bit) between the two data bits stored by the MLC may be an MSB page. A logical page for storing an LSB (Least Significant Bit) between the two data bits stored by the MLC may be an LSB page.

FIG. 7 is a diagram illustrating a physical page and a logical page.

Referring to FIG. 7, a memory block BLK may include first to fourth word lines WL1 to WL4. Memory cells coupled to the first to fourth word lines WL1 to WL4 may constitute first to fourth physical pages P_P1 to P_P4, respectively. When each memory cell of the memory block BLK is an MLC, two logical pages may correspond to one physical page.

In FIG. 7, the memory cells coupled to the first word line WL1 may constitute the first physical page P_P1, and the first physical page P_P1 may correspond to an MSB logical page L_P1 and an LSB logical page L_P2.

Therefore, the unit of data stored by the memory block may be described as a physical page unit or logical page unit.

FIG. 8 is a diagram illustrating a configuration and an operation of a memory controller shown in FIG. 1 in accordance with an embodiment of the present disclosure.

Referring to FIG. 8, the memory controller 200 may include a read operation controller 210, a cell state determiner 220, an error corrector 230, a read counter 240, and a read reclaim controller 250.

The read operation controller 210 may provide a memory device 100 with a read command for reading a selected page by using at least one reference voltage among a plurality of reference voltages.

In an embodiment, the selected page may be a physical page configured with memory cells coupled to a selected word line of a target block. In another embodiment, the selected page may be a logical page corresponding to a physical page configured with memory cells coupled to the selected word line.

In an embodiment, memory cells coupled to the selected word line have a plurality of reference voltages that are default read voltages for distinguishing among an erase state and a plurality of program states.

In another embodiment, memory cells coupled to the selected word line, which can have an erase state or a plurality of program states, may have a plurality of reference voltages that correspond to mean voltages of an initial threshold voltage distribution corresponding the erase state and the plurality of program states. The initial threshold voltage distribution may be a threshold voltage distribution that the memory cells have in a state before memory cell degradation occurs. A mean voltage of a threshold voltage distribution may be predicted through Gaussian Modeling, based on the default read voltages. For example, one reference voltage may be a mean voltage of two default read voltages.

The read operation controller 210 may generate a read command for reading a selected page in response to a request from the host 300, and provide the generated read command to the memory device 100. Alternatively, the read operation controller 210 may provide the memory device 100 with a read command for reading a selected page to perform a background operation, even without a request from the host 300. In other words, when the memory device 100 is in an idle state in which the memory device 100 does not perform an operation in accordance with the request from the host 300, the read operation controller 210 may provide the memory device 100 with a read command for reading a selected page to perform a background operation.

Based on read data received from the memory device 100, the cell state determiner 220 may generate cell state information representing a memory cell degradation degree. The cell state determiner 220 may provide the generated cell state information to the read reclaim controller 250.

As described above and with reference to FIG. 1, the cell state determiner 220 may calculate a memory cell degradation degree, based on a difference in value between a number of memory cells read as first memory cells by a reference voltage (among the memory cells coupled to the selected word line), and a reference number corresponding to the reference voltage. Specifically, the cell state determiner 220 may calculate a memory cell degradation degree corresponding to at least one state among a plurality of states that selected memory cells may have.

The error corrector 230 may perform error correction decoding on read data received from the memory device 100. The error corrector 230 may determine that a read operation has passed when a number of error bits included in the read data is smaller than or equal to the number of error correctable bits obtained by performing the error correction decoding. The error corrector 230 may determine that the read operation has failed when the number of error bits included in the read data is greater than that of error correctable bits that result from performing the error correction decoding.

The error corrector 230 may calculate a bit error rate, which is a rate of error bits included in the read data, based on the result obtained by performing the error correction decoding. The error corrector 230 may generate bit error information representing the bit error rate of the read data. The error corrector 230 may provide the generated bit error information to the read reclaim controller 250.

The read counter 240 may count a number of times a read operation is performed for each memory block. The read counter 240 may generate read count information representing a read count of the target block. The read counter 240 may provide the generated read count information to the read reclaim controller 250.

The read reclaim controller 250 may compare cell state information corresponding to the target block with a first threshold value, and based on the comparison result, may provide the memory device 100 with commands for performing a read reclaim operation of copying data stored in the target block to another block. The first threshold value may be a threshold degradation degree for determining whether a memory cell degradation degree is within a normal range.

Specifically, in order to perform the read reclaim operation, the read reclaim controller 250 may provide the memory device 100 with a read command for reading data stored in the target block. The read reclaim controller 250 may provide the memory device 100 with a program command for storing the data read from the target block in a different block.

The read reclaim controller 250 may determine whether the read reclaim operation on the target block is to be performed, according to a result obtained by comparing a sample value (determined using at least one memory cell degradation degree included in the cell state information) with a first threshold value. The read reclaim controller 250 may determine that the sample value includes a minimum value, a mean value, an intermediate value, and a maximum value of a memory cell degradation degree.

When the sample value is greater than the first threshold value, the read reclaim controller 250 may provide the memory device 100 with the commands for performing a read reclaim operation on the target block. On the contrary, when the sample value is smaller than or equal to the first threshold value, the read reclaim controller 250 may not provide the memory device 100 with the commands for performing the read reclaim operation on the target block.

In another embodiment, the read reclaim controller 250 may compare bit error information corresponding to the target block with a second threshold value, and provide the memory device 100 with the commands for performing the read reclaim operation on the target block according to the comparison result. The second threshold value may be a threshold error rate for determining whether the bit error rate is within a normal range.

Specifically, when the bit error rate including the bit error information is greater than the second threshold value, the read reclaim information 250 may provide the memory device 100 with the commands for performing a read reclaim operation on the target block. On the contrary, when the error bit rate is smaller than or equal to the second threshold value, the read reclaim controller 250 may not provide the memory device 100 with the commands for performing the read reclaim operation on the target block.

In another embodiment, the read reclaim controller 250 may compare the read count information on the target block with a third threshold value, and provide the memory device 100 with the commands for performing the read reclaim operation on the target block.

Specifically, when the read count of the target block, which is included in the read count information, is greater than the third threshold value, the read reclaim controller 250 may select the target block as a read reclaim candidate block. When the read count of the target block, which is included in the read count information, is smaller than or equal to the third threshold value, the read reclaim controller 250 may not select the target block as the read reclaim candidate block. The third threshold value may be a threshold count for selecting the read reclaim candidate block.

The read reclaim controller 250 may determine whether the read reclaim operation is to be performed after selecting the read reclaim candidate block, based on a result obtained by comparing the cell state information corresponding to the target block with the first threshold value and a result obtained by comparing the bit error information corresponding to the target block with the second threshold value.

When the sample value determined based on the cell state information is greater than the first threshold value, the read reclaim controller 250 may provide the memory device 100 with the commands for performing the read reclaim operation on the target block selected as the read reclaim candidate block.

When the bit error rate included in the bit error information is greater than the second threshold value, the read reclaim controller 250 may provide the memory device 100 with the commands for performing the read reclaim operation on the target block selected as the read reclaim candidate block.

On the contrary, if the sample value is smaller than or equal to the first threshold value and the bit error rate is smaller than or equal to the second threshold value, then the read reclaim controller 250 may not provide the memory device 100 with the commands for performing the read reclaim operation on the target block selected as the read reclaim candidate block.

Accordingly, the read reclaim controller 250 does not perform a read reclaim operation on a memory block of which each of the memory cell degradation degree and the bit error rate is smaller than or equal to a threshold value, even when the read count exceeds a threshold value, so that the performance of an unnecessary read reclaim operation can be prevented.

FIG. 9 is a diagram illustrating a read operation controlled by the read operation controller shown in FIG. 8 in accordance with an embodiment of the present disclosure.

Referring to FIG. 9, a case where each memory block includes first to fourth word lines WL1 to WL4 is assumed and described for illustrative convenience. The number of word lines included in the memory block is not limited to this embodiment.

First to nth (n is a natural number greater than 1) physical addresses PBA1 to PBAn may be addresses of physical pages corresponding to word lines of each memory block. For example, the first physical address PBA1 may be an address of a physical page P_P1 corresponding to the first word line WL1 of a first memory block BLK1. The second physical address PBA2 may be an address of a physical page P_P2 corresponding to the second word line WL2 of the first memory block BLK1. In this manner, the nth physical address PBAn may be an address of a physical page P_P4 corresponding to the fourth word line WL4 of a zth memory block BLKz.

The read operation controller may control the memory device to sequentially read physical pages included in all memory blocks BLK1 to BLKz of the memory device, based on a Physical Block Address (PBA). When a read operation is performed based on the PBA, the read operation may be performed on all the physical pages included in the memory blocks, regardless of whether data has been stored in each physical page. When the memory device is in an idle state in which the memory device does not perform an operation in response to a request from the host, the read operation controller may control the memory device to sequentially read the physical pages, based on the PBA, so as to perform a background operation.

FIG. 10 is a diagram illustrating a read operation controlled by the read operation controller shown in FIG. 8 in accordance with another embodiment of the present disclosure.

Referring to FIG. 10, each memory block may store data corresponding to first to fourth logical pages L_P1 to L_P4. A number of logical pages corresponding to each memory block may be variously determined according to a number of word lines included in the memory block and a number of data bits stored by a memory cell coupled to a word line.

For example, when a memory block includes two word lines, and a memory cell of the memory block is a Multi-Level Cell (MLC) for storing two data bits, and the memory block may store data corresponding to four logical pages. Referring to FIG. 7, memory cells coupled to one word line may constitute one physical page, and one physical page may correspond to two logical pages.

A logical address of data provided by the host may be determined regardless of a physical address at which the data is stored. In FIG. 10, a first logical address LBA1 may be an address of the third logical page L_P3 of the first memory block BLK1. The second logical address LBA2 may be an address of the first logical page L_P1 of the third memory block BLK3.

The read operation controller may control the memory device 100 to sequentially read logical pages corresponding to all Logical Block Addresses (LBAs) at which data is stored. When the memory device is in an idle state in which the memory device does not perform an operation in response to a request from the host, the read operation controller may control the memory device to sequentially read the logical pages, based on the LBAs, so as to perform a background operation.

Unlike FIG. 9, when a read operation is performed based on the LBAs, the read operation may be performed only on logical pages in which data is stored.

FIG. 11 is a diagram illustrating an initial threshold voltage distribution.

Referring to FIG. 11, the horizontal axis of the graph represents threshold voltages of memory cells, and the vertical axis of the graph represents number of memory cells.

In FIG. 11, a case where memory cells coupled to a selected word line are MLCs is assumed and described. Each MLC may be programmed to have any one state among an erase state E and first to third program states P1 to P3. The MLCs may be programmed at the same rate for each state. Therefore, memory cells may be programmed at a rate of 25% to any one state among a total of four states E, P1, P2, and P3. When assuming that a total number of memory cells is 1000, the number of memory cells belonging to a threshold voltage distribution corresponding to each state may be 250.

In FIG. 11, the threshold voltage distribution corresponding to each state may be an initial threshold voltage distribution that the memory cells have before memory cell degradation occurs. The initial threshold voltage distribution may be predicted through Gaussian modeling. In another example, a variation of the initial threshold voltage distribution based on Gaussian modeling may be a predetermined value. A mean of the initial threshold voltage distribution for the Gaussian modeling may be determined as follows.

Specifically, mean voltages mean_E, mean_P1, mean_P2, and mean_P3 may be threshold voltage distributions corresponding to the erase state E and the first to third program states P1 to P3. The mean voltages mean_E, mean_P1, mean_P2, and mean_P3 may be predicted using Gaussian modeling, based on default read voltages Vr1 to Vr3.

For example, the mean voltage mean_P1 of the threshold voltage distribution corresponding to the first program state P1 may be predicted as a mean value of two adjacent default read voltages Vr1 and Vr2. The mean voltage mean_E of the threshold voltage distribution corresponding to the erase state E may be predicted based on the fact that a distance between the mean voltage mean_E and a first default read voltage Vr1 is equal to that between the mean voltage mean_P1 and the first default read voltage Vr1. In other words, the mean voltage mean_E may be predicted based on the fact that a mean voltage of the mean voltage mean_E and the mean voltage mean_P1 is the first default read voltage Vr1. The other mean voltages mean_P2 and mean P3 may also be predicted in the same manner.

When the number of memory cells belonging to each threshold voltage distribution is 250, the threshold voltage distribution follows a Gaussian distribution, and therefore, the number of memory cells belonging to a threshold voltage interval lower than the mean voltage of the threshold voltage distribution may be 125. The number of memory cells belonging to a threshold voltage interval higher than the mean voltage of the threshold voltage distribution may be 125.

In FIG. 11, a1 to a5 may represent numbers of memory cells belonging to voltage intervals divided using a plurality of reference voltages among the memory cells having initial threshold voltage distributions predicted through the Gaussian modeling. The plurality of reference voltages may be the mean voltages mean_E, mean_P1, mean_P2, and mean_P3 corresponding to the respective initial threshold voltage distributions.

a1 may be 125 as the number of memory cells belonging to a threshold voltage interval lower than the mean voltage mean_E. a2 may be 250, which is the sum of 125 as the number of memory cells belonging to a threshold voltage interval higher than the mean voltage mean_E, and 125 as the number of memory cells belonging to a threshold voltage interval lower than the mean voltage mean_P1. In this manner, each of a3 and a4 may be 250. a5 may be 125 as the number of memory cells having threshold voltages higher than the mean voltage mean_P3.

FIG. 12 is a diagram illustrating a measured threshold voltage distribution shifted to the left.

Referring to FIG. 12, when retention of a memory cell is performed, a threshold voltage of the memory cell decreases while electric charges charged in a trap region of the memory cell are being discharged, and a measured threshold voltage distribution of memory cells may be further shifted to the left than the initial threshold voltage distribution shown in FIG. 11.

Thus, mean voltages mean_E', mean_P1', mean_P2', and mean_P3' of the measured threshold voltage distribution may also be further shifted to the left than the mean voltages mean_E, mean_P1, mean_P2, and mean_P3 of the initial threshold voltage distribution.

Memory cells belonging to regions S1 to S4 may be memory cells of which threshold voltages decrease from levels higher than those of the mean voltages mean_E', mean_P1, mean_P2, and mean_P3' to levels lower than those of the mean voltages mean_E, mean_P1, mean_P2, and mean_P3, respectively. For example, memory cells belonging to the region S1 may be memory cells of which threshold voltages decreases from a level higher than that of the mean voltage mean_E' to a level lower than that of the mean voltage mean_E.

Degrees to which the mean voltages of the corresponding threshold voltage distributions are shifted to the left may be predicted using numbers of memory cells belonging to the regions S1 to S4, respectively. The degrees to which the mean voltages of the threshold voltage distributions are shifted may be used as data for determining a degradation degree of memory cells. A method for calculating numbers of memory cells belonging to the regions S1 to S4 will be described later in FIG. 13.

For example, since the number of memory cells belonging to the region S1 is 50, which among the regions S1 to S4 is the largest number, it may be determined that the degradation degree of memory cells belonging to a threshold voltage distribution corresponding to an erase state E' is the greatest. Since the number of memory cells belonging to the region S3 among the regions S1 to S4 is 30, which is the lowest, it may be determined that the degradation degree of memory cells belonging to a threshold voltage distribution corresponding to a second program state P2' is the smallest among the four distributions.

FIG. 13 is a diagram illustrating calculation of memory cell degradation degrees, based on FIG. 12.

Referring to FIG. 13, a memory cell degradation degree may be obtained through a difference value between a number of memory cells read as on-cells by a reference voltage and a reference number corresponding to the reference voltage. The reference number may be a number of memory cells, which is predicted through Gaussian modeling, to be read as on-cells by the reference voltage among memory cells having an initial threshold voltage distribution.

Alternatively, the memory cell degradation degree may be obtained through a difference value between a number of memory cells read as off-cells by a reference voltage and a reference number corresponding to the reference voltage. The reference number may be a number of memory cells, which is predicted through Gaussian modeling, to be read as off-cells by the reference voltage among memory cells having an initial threshold voltage distribution.

In FIG. 13, the calculation of memory cell degradation degrees will be described based on the number of memory cells read as on-cells by the reference value.

b1 to b5 may represent numbers of memory cells belonging to voltage intervals divided using a plurality of reference voltages based on distributed threshold voltages for memory cells in which degradation has occurred. The plurality of reference voltages may be the mean voltages mean_E, mean_P1, mean_P2, and mean_P3 corresponding to the respective initial threshold voltage distributions.

As an example, a number b1 of memory cells read as on-cells by the reference voltage mean_E among memory cells coupled to a selected word line may be 175. A number b1+b2 of memory cells read as on-cells by the reference voltage mean_P1 may be 415. A number b1+b2+b3 of memory cells read as on-cells by the reference voltage mean_P2 may be 655. A number b1+b2+b3+b4 of memory cells read as on-cells by the reference voltage mean_P3 may be 915.

In various embodiments, the reference number may be determined based on a plurality of reference voltages of a number of selected memory cells coupled to a selected word line. The number of the selected memory cells may be 1000, and the plurality of reference voltages may be voltages corresponding to an erase state and first to third program states. A reference voltage corresponding to the erase state may be mean_E, and a reference number corresponding to mean_E may be 125. A reference voltage corresponding to the first program state may be mean_P1, and a reference number corresponding to mean_P1 may be 375. A reference voltage corresponding to the second program state may be mean_P2, and a reference number corresponding to mean_P2 may be 625. A reference voltage corresponding to the third program state may be mean_P3, and a reference number corresponding to mean_P3 may be 875. A method for calculating a reference number corresponding to each reference voltage will be described later in the following paragraph.

A number a1 of memory cells read as on-cells by the reference voltage mean_E among the memory cells coupled to the selected word line, which have an initial threshold voltage distribution predicted through the Gaussian modeling, may be 125. A number a1+a2 of memory cells read as on-cells by the reference voltage mean_P1 among the memory cells having the initialization threshold voltage distribution may be 375. A number a1+a2+a3 of memory cells read as on-cells by the reference voltage mean_P2 among the memory cells having the initialization threshold voltage distribution may be 625. A number a1+a2+a3+a4 of memory cells read as on-cells by the reference voltage mean_P3 among the memory cells having the initialization threshold voltage distribution may be 875.

A memory cell degradation degree of memory cells belonging to a threshold voltage distribution corresponding to the erase state E' may be 50, which is a difference value between 175 as the number of memory cells read as on-cells by the reference voltage mean_E, and 125 as the reference number corresponding to the reference voltage mean_E. The number of memory cells belonging to the region S1 may be 50.

A memory cell degradation degree of memory cells belonging to a threshold voltage distribution corresponding to the a first program state P1' may be 40, which is a difference value between 415 as the number of memory cells read as on-cells by the reference voltage mean_P1, and 375 as the reference number corresponding to the reference voltage mean_P1. The number of memory cells belonging to the region S2 may be 40.

A memory cell degradation degree of memory cells belonging to a threshold voltage distribution corresponding to the second program state P2' may be 30, which is a difference value between 655 as the number of memory cells read as on-cells by the reference voltage mean_P2, and 625 as the reference number corresponding to the reference voltage mean_P2. The number of memory cells belonging to the region S3 may be 30.

A memory cell degradation degree of memory cells belonging to a threshold voltage distribution corresponding to a third program state P3' may be 40, which is a difference value between 915 as the number of memory cells read as on-cells by the reference voltage mean_P3, and 875 as the reference number corresponding to the reference voltage mean_P3. The number of memory cells belonging to the region S4 may be 40.

FIG. 14 is a diagram illustrating a measured threshold voltage distribution shifted to the right.

Referring to FIG. 14, when a memory cell is influenced by a disturb, a threshold voltage of the memory cell increases while electric charges are being charged in a trap region of the memory cell, and a measured threshold voltage distribution of memory cells may be further shifted to the right than the initial threshold voltage distribution shown in FIG. 11. The disturb may occur when a voltage is applied to a word line to which memory cells are coupled.

Thus in FIG. 14, mean voltages mean_E', mean_P1", mean_P2', and mean_P3" of the measured threshold voltage distribution may be shifted to the right than the mean voltages mean_E, mean_P1, mean_P2, and mean_P3 of the initial threshold voltage distribution.

Memory cells belonging to regions S1' to S4' may be memory cells of which threshold voltages decrease from levels lower than those of the mean voltages mean_E, mean_P1, mean_P2, and mean_P3 to levels higher than those of the mean voltages mean_E, mean_P1, mean_P2, and mean_P3, respectively. For example, memory cells belonging to the region S1' may be memory cells of which threshold voltages decreases from a level lower than that of the mean voltage mean_E" to a level higher than that of the mean voltage mean_E.

Degrees to which the mean voltages of the corresponding threshold voltage distributions are shifted to the right may be predicted through numbers of memory cells belonging to the regions S1' to S4', respectively. The degrees to which the mean voltages of the threshold voltage distributions are shifted may be used as data for determining a degradation degree of memory cells. A method for calculating numbers of memory cells belonging to the regions S1' to S4' will be described later in FIG. 15.

For example, since the number of memory cells belonging to the region S4' is 60, which among the regions S1' to S4' is the highest number, it may be determined that the degradation degree of memory cells belonging to a threshold voltage distribution corresponding to a third program state P3" is the greatest. Since the number of memory cells belonging to the region S1' among the regions S1' to S4' is 40, which is the smallest, it may be determined that the degradation degree of memory cells belonging to a threshold voltage distribution corresponding to an erase state E" is the smallest.

FIG. 15 is a diagram illustrating a calculation of memory cell degradation degrees, based on FIG. 14.

Referring to FIG. 15, like FIG. 13, the calculation of memory cell degradation degrees will be described based on numbers of memory cells read as on-cells by reference voltages.

c1 to c5 may be numbers of memory cells belonging to voltage intervals, divided using a plurality of reference voltages based on threshold voltage distributions for memory cells in which degradation has occurred, respectively. The plurality of reference voltages may be the mean voltages mean_E, mean_P1, mean_P2, and mean_P3 corresponding to the respective initial threshold voltage distributions.

A number c1 of memory cells read as on-cells by the reference voltage mean_E among memory cells coupled to a selected word line may be 85. A number c1+c2 of memory cells read as on-cells by the reference voltage mean_P1 may be 330. A number c1+c2+c3 of memory cells read as on-cells by the reference voltage mean_P2 may be 575. A number c1+c2+c3+c4 of memory cells read as on-cells by the reference voltage mean_P3 may be 815.

Reference numbers corresponding to the respective reference voltages may be equal to those shown in FIG. 13.

A memory cell degradation degree, of memory cells belonging to a threshold voltage distribution corresponding to the erase state E', may be −40, which is a difference value between 85 as the number of memory cells read as on-cells by the reference voltage mean_E, and 125 as the reference number corresponding to the reference voltage mean_E. The number of memory cells belonging to the region S1' may be 40.

A memory cell degradation degree of memory cells belonging to a threshold voltage distribution corresponding to the a first program state P1" may be −45, which is a difference value between 330 as the number of memory cells read as on-cells by the reference voltage mean_P1, and 375 as the reference number corresponding to the reference voltage mean_P1. The number of memory cells belonging to the region S2' may be 45.

A memory cell degradation degree of memory cells belonging to a threshold voltage distribution corresponding to a second program state P2" may be −50, which is a difference value between 575 as the number of memory cells read as on-cells by the reference voltage mean_P2, and 625 as the reference number corresponding to the reference voltage mean_P2. The number of memory cells belonging to the region S3' may be 50.

A memory cell degradation degree of memory cells belonging to a threshold voltage distribution corresponding to the third program state P3' may be −60, which is a difference value between 815 as the number of memory cells read as on-cells by the reference voltage mean_P3, and 875 as the reference number corresponding to the reference voltage mean_P3. The number of memory cells belonging to the region S4' may be 60.

When a memory cell degradation degree is calculated based on on-cells, as compared with FIG. 13, it can be seen that, when the memory cell degradation degree is a positive value, the measured threshold voltage distribution is further shifted to the left than the initial threshold voltage distribution. In addition, it can be seen that, when the memory cell degradation degree is a negative value, the measured threshold voltage distribution is further shifted to the right than the initial threshold voltage distribution.

FIG. 16 is a diagram illustrating conditions for performing a read reclaim operation in accordance with an embodiment of the present disclosure.

Referring to FIG. 16, a read reclaim operation on a target block may be performed according to a result obtained by comparing a memory cell degradation degree and a first threshold value and a result obtained by comparing a bit error rate and a second threshold value. The first threshold value may be a threshold degradation degree for determining whether the memory cell degradation degree is within a normal range. The threshold degradation degree may be a reference value for determining whether a memory block is a target block on which the read reclaim operation is to be performed according to the memory cell degradation degree. The second threshold value may be a threshold error rate for determining whether the bit error rate is within a normal range. The threshold error rate may be a reference value for determining whether a memory block is a target block on which the read reclaim operation is to be performed according to the bit error rate. The memory cell degradation degree may be obtained through data read from memory cells coupled to a selected word line included in a target block. The bit error rate may be obtained through error correction decoding on the read data.

In various embodiments, a read reclaim operation on a target block may be performed based on a result obtained by comparing a sample value, determined using at least one memory cell degradation degree, with the first threshold value. The sample value may include a minimum value, a mean value, an intermediate value, and a maximum value of the at least one memory cell degradation degree. Alternatively, the sample value may be a value calculated by substituting the at least one memory cell degradation degree into an equation for appropriately reflecting a state in which the target block is degraded.

When the memory cell degradation degree is greater than the first threshold value or when the bit error rate is greater than the second threshold value, the read reclaim operation on the target block may be performed. When the memory cell degradation degree is smaller than or equal to the first threshold value, or when the bit error rate is smaller than or equal to the second threshold value, the read reclaim operation on the target block may not be performed. The first threshold value may be a threshold degradation value for determining whether the memory cell degradation degree is within a normal range. The second threshold value may be a threshold error rate for determining whether the bit error rate is within a normal range.

In FIG. 16, the conditions for performing the read reclaim operation may be determined regardless of a read count of the target block.

FIG. 17 is a diagram illustrating conditions for performing the read reclaim operation in accordance with an embodiment of the present disclosure.

Referring to FIG. 17, as compared with FIG. 16, the read reclaim operation may be performed by considering the read count of the target block. When the read count of the target block is smaller than or equal to a third threshold value, the read reclaim operation on the target block may not be performed. The third threshold value may be a threshold count for determining whether the read count is within a normal range. The threshold count may be a reference value for determining whether a memory block is a block on which the read reclaim operation is to be performed according to the read count.

When the read count of the target block is greater than the third threshold value, the target block may be selected as a read reclaim candidate block. The read reclaim operation on the target block selected as a read reclaim candidate block may be performed in the same manner as described with reference to FIG. 16 according to a result obtained by comparing the memory cell degradation degree and the first threshold value and a result obtained by comparing the error bit rate and the second threshold value.

FIG. 18 is a flowchart illustrating an operation of a storage device in accordance with an embodiment of the present disclosure.

Referring to FIG. 18, in step S1801, the storage device may read memory cells coupled to a selected word line of a target block.

In step S1803, the storage device may calculate a memory cell degradation degree of the target block by comparing a read result and a Gaussian modeling result. The Gaussian modeling result may be a reference number predicted through Gaussian modeling.

In step S1805, when the memory cell degradation degree is greater than a threshold value, the storage device may perform a read reclaim operation on the target block. The threshold value may be a threshold degradation degree.

FIG. 19 is a flowchart illustrating in detail FIG. 18.

Referring to FIG. 19, in step S1901, the storage device may read memory cells coupled to a selected word line of a target block. The storage device may read the memory cells coupled to the selected word line by using at least one reference voltage among a plurality of reference voltages. The plurality of reference voltages may be mean voltages of initial threshold voltage distributions respectively corresponding to an erase state and a plurality of program states of the memory cells.

In step S1903, the storage device may calculate a memory cell degradation degree by comparing a number of memory cells read as first memory cells with a reference number predicted through Gaussian modeling. The first memory cell may be any one of an on-cell and an off-cell.

In step S1905, the storage device may determine whether the memory cell degradation degree is greater than a threshold value. As the determination result, when the memory cell degradation degree is greater than the threshold value, the operation proceeds to step S1907. When the memory cell degradation degree is smaller than or equal to the threshold value, the operation is ended. In various embodiments, the storage device may compare a sample value determined based on at least one memory cell degradation degree with the threshold value.

In the step S1907, the storage device may copy data stored in the target block to another block.

FIG. 20 is a flowchart illustrating an operation of the storage device in accordance with another embodiment of the present disclosure.

Referring to FIG. 20, in step S2001, the storage device may read memory cells coupled to a word line of a target block.

In step S2003, the storage device may calculate a memory cell degradation degree by comparing a number of memory cells read as first memory cells with a reference number predicted through Gaussian modeling.

In step S2005, the storage device may calculate a bit error rate, based on read data.

In step S2007, the storage device may calculate a read count of the target block. The steps S2003, S2005, and S2007 may be independently performed. Therefore, the performance order of the steps may be changed. Alternatively, the steps may be performed at the same time.

In step S2009, the storage device may determine whether the read count is greater than a third threshold value. As the determination result, when the read count is greater than the third threshold value, the operation proceeds to step S2011. When the read count is smaller than or equal to the third threshold value, the operation is ended.

In the step S2011, the storage device may determine whether the memory cell degradation degree is greater than a first threshold value. As the determination result, when the memory cell degradation degree is greater than the first threshold value, the operation proceeds to step S2015. When the memory cell degradation degree is smaller than or equal to the first threshold value, the operation proceeds to step S2013.

In the step S2013, the storage device may determine whether the bit error rate is greater than a second threshold value. As the determination result, when the bit error rate is greater than the second threshold value, the operation proceeds to the step S2015. When the bit error rate is smaller than or equal to the second threshold value, the operation is ended.

The determination order of the steps S2011 and S2013 may be reversed.

In the step S2015, the storage device may copy data stored in the target block to another block.

FIG. 21 is a diagram illustrating another embodiment of the memory controller shown in FIG. 1.

Referring to FIG. 21, a memory controller 1000 is coupled to a host and a memory device. The memory controller 1000 is configured to access the memory device in response to a request received from the host. For example, the memory controller 1000 is configured to control read, program, erase, and background operations of the memory device. The memory controller 1000 is configured to provide an interface between the memory device and the host. The memory controller 1000 is configured to drive firmware for controlling the memory device.

The memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000, and perform a logical operation. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device, using the memory buffer 1020 as a working memory, a cache memory or a buffer memory.

The processor 1010 may perform a function of a flash translation layer (FTL). The processor 1010 may translate a logical block address (LBA) provided by the host through the FTL into a physical block address (PBA). The FTL may receive an LPA, using a mapping table, to be translated into a PBA. Several address mapping methods of the FTL exist according to mapping units. A representative address mapping method includes a page mapping method, a block mapping method, and a hybrid mapping method.

The processor 1010 is configured to randomize data received from the host. For example, the processor 1010 may randomize data received from the host, using a randomizing seed. The randomized data is provided as data to be stored to the memory device to be programmed in the memory cell array.

In a read operation, the processor 1010 is configured to derandomize data received from the memory device. For example, the processor 1010 may derandomize data received from the memory device, using a derandomizing seed. The derandomized data may be output to the host.

In an embodiment, the processor 1010 may perform randomizing and derandomizing by driving software or firmware.

The memory buffer 1020 may be used as the working memory, the cache memory, or the buffer memory of the processor 1010. The memory buffer 1020 may store codes and commands, which are executed by the processor 1010. The memory buffer 1020 may include a Static RAM (SRAM) or a Dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may communicate with the host, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a NonVolatile Memory Express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

In an example, the memory controller 1000 may not include the memory buffer 1020 and the buffer control circuit 1050.

In an example, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

In an example, the bus 1070 of the memory controller 1000 may be divided into a control bus and a data bus. The data bus may be configured to transmit data in the memory controller 1000, and the control bus may be configured to transmit control information such as a command and an address in the memory controller 1000. The data bus and the control bus are separated from each other, and may not interfere or influence with each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

FIG. 22 is a block diagram illustrating a memory card system to which the storage device is applied in accordance with an embodiment of the present disclosure.

Referring to FIG. 22, the memory card system 2000 includes a memory controller 2100, a memory device, and a connector 2300.

The memory controller 2100 is coupled to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to driver firmware for controlling the memory device 2200. The memory controller 2100 may be implemented identically to the memory controller 200 described with reference to FIG. 1.

In an example, the memory controller 2100 may include components such as a Random Access Memory (RAM), a processing unit, a host interface, a memory interface, and an ECC circuit.

The memory controller 2100 may communicate with an external device through the connector 2300. The memory controller 2100 may communicate with the external device (e.g., the host) according to a specific communication protocol. In an example, the memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

In an example, the memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

FIG. 23 is a block diagram exemplarily illustrating a Solid State Drive (SSD) system to which the storage device is applied in accordance with an embodiment of the present disclosure.

Referring to FIG. 23, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal SIG received from the host 3100. In an example, the signal SIG may be a signal based on an interface between the host 3100 and the SSD 3200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is coupled to the host 3100 through the power connector 3002. When the supply of power from the host 3100 is not smooth, the auxiliary power supply 3230 may provide power of the SSD 3200. In an example, the auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

FIG. 24 is a block diagram illustrating a user system to which the storage device is applied in accordance with an embodiment of the present disclosure.

Referring to FIG. 24, the user system 4000 includes an application processor 4100, a memory module 4200, a network module 4300, a storage module 4400, and a user interface 4500.

The application processor 4100 may drive components included in the user system 4000, an operating system (OS), a user program, or the like. In an example, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. In an example, the application processor 4100 and the memory module 4200 may be provided as one semiconductor package by being packaged based on a Package on Package (PoP).

The network module 4300 may communicate with external devices. In an example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. In an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In an example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. In an example, the storage module 4400 may be provided as a removable drive such as a memory card of the user system 4000 or an external drive.

In an example, the storage module 4400 may include a plurality of nonvolatile memory devices, and the plurality of nonvolatile memory devices may operate identically to the memory device 100 described with reference to FIG. 1. The storage module 4400 may operate identically to the storage device 50 described with reference to FIG. 1.

The user interface 4500 may include interfaces for inputting data or commands to the application processor 4100 or outputting data to an external device. In an example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, there can be provided a storage device having improved wear-leveling performance and an operating method thereof.

What is claimed is:

1. A memory controller for controlling a memory device including a plurality of memory blocks, the memory controller comprising:

a read operation controller configured to control the memory device to read selected memory cells of a first block among the plurality of memory blocks by using at least one reference voltage among a plurality of reference voltages;

a cell state determiner configured to compare a number of memory cells among the selected memory cells that are read as first memory cell with a reference number corresponding to the at least one reference voltage, and to generate cell state information indicating a memory cell degradation degree corresponding to at least one state among a plurality of states; and a read claim controller configured to control the memory device to copy data stored in the first block to a second block selected from the plurality of memory blocks, based on a comparison between the memory cell degradation degree with a threshold degradation degree, wherein the plurality of reference voltages are mean voltages of initial threshold voltage distributions that correspond to the plurality of states.

2. The memory controller of claim 1, wherein the cell state determiner compares the reference number among a plurality of reference numbers with the number of the memory cells read as the first memory cell, and wherein the plurality of reference numbers are determined based on the number of the selected memory cells and the plurality of reference voltages.

3. The memory controller of claim 2, wherein the first memory cell is one of an on-cell or an off-cell.

4. The memory controller of claim 1, wherein the plurality of reference voltages are default read voltages for distinguishing the plurality of states.

5. The memory controller of claim 1, wherein the cell state determiner calculates the memory cell degradation degree using a difference between the number of the memory cells read as the first memory cell and the reference number.

6. The memory controller of claim 1, wherein the read reclaim controller controls the memory device to copy the data stored in the first block to the second block, when a sample value determined based on the memory cell degradation degree is greater than the threshold degradation degree.

7. The memory controller of claim 6, wherein the read reclaim controller determines that the sample value includes a minimum value, a mean value, an intermediate value, and a maximum value of the memory cell degradation degree.

8. The memory controller of claim 1, further comprising an error corrector configured to perform error correction decoding on data read from the selected memory cells, and to generate bit error information representing a bit error rate, based on a result obtained by performing the error correction decoding.

9. The memory controller of claim 8, wherein the read reclaim controller controls the memory device to copy the data stored in the first block to the second block, based on a result obtained by comparing the bit error rate with a threshold error rate.

10. The memory controller of claim 1, wherein the read operation controller controls the memory device to read a plurality of logical pages at which data is stored when the memory device is in an idle state, and wherein the plurality of logical pages include at least one logical page corresponding to a physical page comprising the selected memory cells.

11. The memory controller of claim 1, wherein the read operation controller controls the memory device to read physical pages included in all of the plurality of memory blocks when the memory device is in an idle state, and wherein one of the physical pages includes the selected memory cells.

12. A memory controller for controlling a memory device including a plurality of memory blocks, the memory controller comprising:

a read operation controller configured to control the memory device to read selected memory cells of a first block among the plurality of memory blocks by using at least one reference voltage among a plurality of reference voltages;

a cell state determiner configured to compare a number of memory cells, among the selected memory cells, read as first memory cell by the at least one reference voltage with a reference number corresponding to the at least one reference voltage, and to generate cell state information indicating a memory cell degradation degree corresponding to at least one state among a plurality of states;

a read counter configured to generate a read count information indicating a read count which is a number of times read operations are performed on the first block;

an error corrector configured to perform error correction decoding on data read from the selected memory cells, and to generate bit error information indicating a bit error rate based on a result of the error correction decoding; and a read reclaim controller configured to control the memory device to copy data stored in the first block to a second block among the plurality of memory blocks, based on a result obtained by comparing the cell state information with a threshold degradation degree and a result obtained by comparing the bit error information with a threshold error rate, when the read count is greater than a threshold count, wherein the plurality of reference voltages are mean voltages of initial threshold voltage distributions that correspond to the plurality of states.

13. The memory controller of claim 12, wherein the cell state determiner compares the reference number corresponding to the at least one voltage with the number of the memory cells read as the first memory cells, and wherein the first memory cell is any one of an on-cell and an off-cell.

14. A storage device comprising:

a memory device including a plurality of memory blocks each having a plurality of memory cells; and a memory controller configured to control the memory device to read selected memory cells of a first block among the plurality of memory blocks by using at least one reference voltage among a plurality of reference voltages, to calculate a memory cell degradation degree corresponding to at least one state among a plurality of states, based on a result obtained by comparing a number of memory cells read as first memory cells by the at least one reference voltage among the selected memory cells with a reference number corresponding to the at least one reference voltage, and to control the memory device to copy data stored in the first block to a second block among the plurality of memory blocks, according to a result obtained by comparing a sample value determined based on the memory cell degradation degree corresponding to the at least one state with a threshold degradation degree, wherein the plurality of reference voltages are mean voltages of initial threshold voltage distributions that correspond to the plurality of states.

15. The storage device of claim 14, wherein the reference number is a reference number corresponding to the at least one voltage among a plurality of reference numbers determined based on a number of the selected memory cells and the plurality of reference voltages, and wherein the first memory cell is any one of an on-cell and an off-cell.

16. A method for operating a storage device including a plurality of memory blocks, the method comprising:

reading selected memory cells of a first block among a plurality of memory blocks by using at least one reference voltage among a plurality of reference voltages;

calculating a memory cell degradation degree corresponding to at least one state among a plurality of states, based on the result obtaining by comparing a number of memory cells read as first memory cells by the at least one reference voltage among the selected memory cells with a reference number corresponding to the at least one reference voltage among a plurality of reference numbers; and copying data stored in the first block to a second block among the plurality of memory blocks based on a comparison result between the memory cell degradation degree and a threshold degradation degree, wherein the plurality of reference voltages are mean voltages of initial threshold voltage distributions that correspond to the plurality of states.

17. The method of claim 16, wherein the plurality of reference numbers are determined based on a number of the selected memory cells and the plurality of reference voltages, and wherein the first memory cell is one of an on-cell or an off-cell.

18. The method of claim 16, further comprising calculating a bit error rate based on a result of error correction decoding on data read from the selected memory cells, wherein the copying includes copying the data stored in the first block to the second block, based on a comparison result between the bit error rate and a threshold error rate.

19. The method of claim 16, further comprising calculating a read count which is a number of times read operation are performed on the first block, wherein the copying includes copying the data stored in the first block is copied to the second block, when the read count is greater than a threshold count.

* * * * *